United States Patent [19]
Kochi et al.

[11] Patent Number: 6,166,583
[45] Date of Patent: *Dec. 26, 2000

[54] SEMICONDUCTOR DEVICE, AND OPERATING DEVICE, SIGNAL CONVERTER, AND SIGNAL PROCESSING SYSTEM USING THE SEMICONDUCTOR DEVICE

[75] Inventors: Tetsunobu Kochi, Hiratsuka; Mamoru Miyawaki, Isehara, both of Japan

[73] Assignee: Canon Kabushi Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/548,672

[22] Filed: Oct. 26, 1995

[30] Foreign Application Priority Data

Oct. 28, 1994 [JP] Japan .................................. 6-265041

[51] Int. Cl.$^7$ .................................................. H03K 17/76
[52] U.S. Cl. ........................ 327/407; 327/407; 327/94; 327/361; 364/604
[58] Field of Search .................... 327/91, 93, 94, 327/95, 96, 97, 105, 106, 107, 355, 361, 407; 364/604, 606

[56] References Cited

U.S. PATENT DOCUMENTS

| | | | |
|---|---|---|---|
| 4,255,715 | 3/1981 | Cooperman | 330/9 |
| 4,421,996 | 12/1983 | Chuang et al. | 307/530 |
| 4,588,905 | 5/1986 | Kojima | 327/91 |
| 5,287,108 | 2/1994 | Mayes et al. | 341/156 |
| 5,337,270 | 8/1994 | Kawata et al. | 365/149 |
| 5,341,050 | 8/1994 | Mellissinos et al. | 327/91 |
| 5,408,422 | 4/1995 | Takatori et al. | 327/94 |
| 5,420,806 | 5/1995 | Shou et al. | 364/606 |
| 5,428,237 | 6/1995 | Yuzurihara | 257/349 |
| 5,466,961 | 11/1995 | Kikuchi et al. | 257/379 |

FOREIGN PATENT DOCUMENTS

| | | |
|---|---|---|
| 0569856 | 11/1993 | European Pat. Off. |
| 2536922 | 6/1984 | France. |
| 4402952 | 6/1994 | Germany. |

OTHER PUBLICATIONS

"An Economical Majority Logic IC Materialized by the CMOS", Nikkei Electronics, Nov. 5, 1973, pp. 132–144.

Electronic Design, vol. 42, No. 7, Apr. 4, 1994, pp. 67/68, 70–73, XP0000443251, Martin BC: "Tips for Straddling the 3–v to 5–v Fence".

Patent Abstracts of Japan, vol. 13, No. 309 (p. 898), Jul. 14, 1989 Kokai 01–081082.

*Primary Examiner*—Jung Ho Kim
*Assistant Examiner*—Tim Callahan
*Attorney, Agent, or Firm*—Fitzpatrick, Cella, Harper & Scinto

[57] ABSTRACT

There is disclosed a semiconductor device in which capacitor means are connected to multiple input terminals via latch means, and the terminals on one side of the capacitor means are commonly connected to the input of a sense amplifier, thereby attaining a reduction of the circuit scale, improvement of the operation speed, saving of the consumption power, reduction of the manufacturing cost, and improvement of the manufacturing yield.

31 Claims, 17 Drawing Sheets

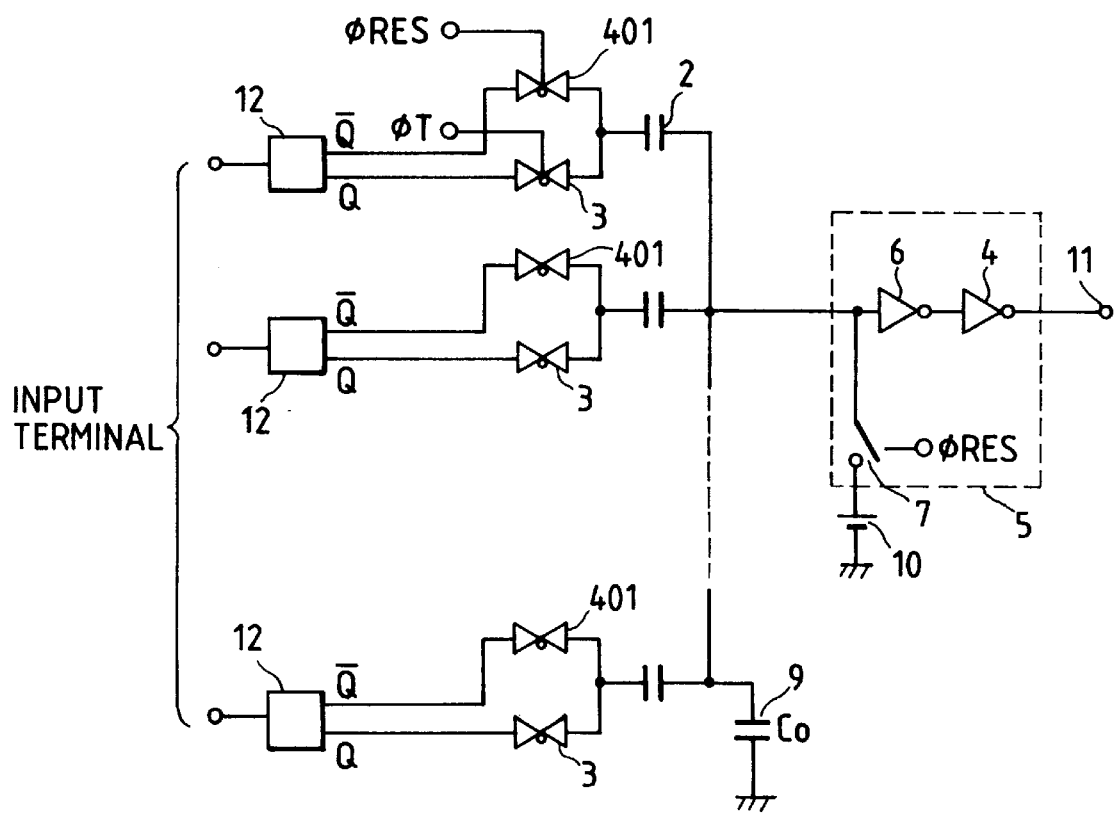

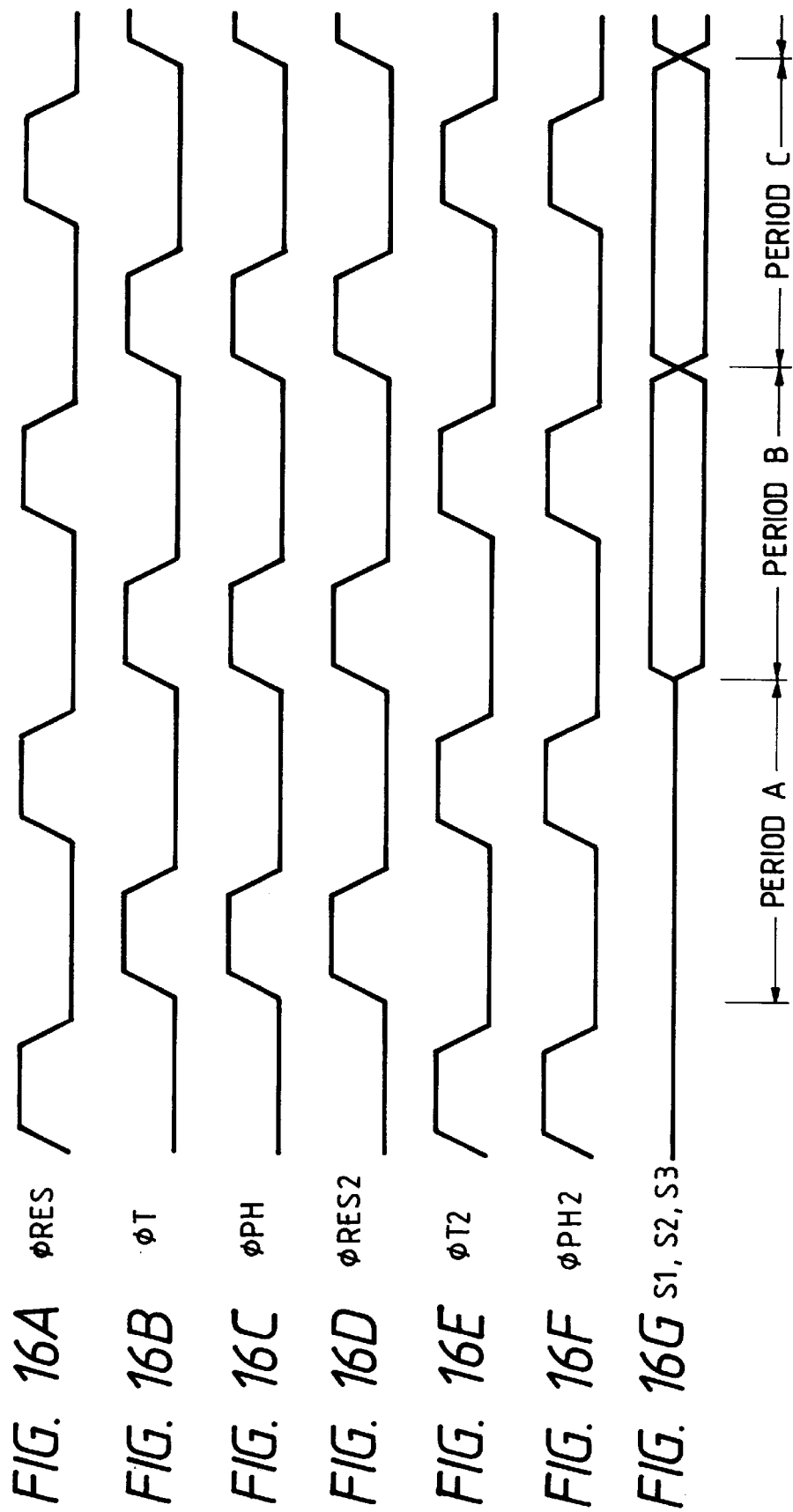

SEMICONDUCTOR DEVICE, AND OPERATING DEVICE, SIGNAL CONVERTER, AND SIGNAL PROCESSING SYSTEM USING THE SEMICONDUCTOR DEVICE

BACKGROUND OF THE INVENTION

1. Field of the Invention

The present invention relates to a semiconductor device, and an operating device, a signal converter, and a signal processing system using the semiconductor device and, more particularly, to a semiconductor device which can perform parallel arithmetic operations, and an operating device which can perform an arithmetic operation such as a correlation arithmetic operation, a signal converter for A/D (analog-to-digital) or D/A (digital-to-analog) converting a signal, and a signal processing system using the semiconductor device.

2. Related Background Art

In a conventional semiconductor device that performs parallel arithmetic operation processing, since the circuit scale increases in progression as the number of signals to be subjected to parallel arithmetic operations increases, the manufacturing cost increases, and the yield is lowered. Due to an increase in delay amount of, e.g., wiring lines or due to an increase in the number of times of arithmetic operations in the circuit upon an increase in circuit scale, the operation speed decreases. Furthermore, the consumption power increases considerably.

For example, in the case of a solid-state image pickup device shown in FIG. 1, time-series analog signals output from a sensing unit 60, in which image pickup elements 41 are arranged two-dimensionally, and which serves as an area sensor, are converted into digital signals by an A/D converter 40, and are temporarily stored in a frame memory 39. These signals are processed by an arithmetic operation circuit 38, and the processed signals are output from an arithmetic operation output circuit 50. More specifically, by executing a correlation arithmetic operation between data obtained at different times, the moving amount ($\Delta X$, $\Delta Y$) of an object or the like can be output.

However, in order to perform real-time processing of a dynamic image, the number of processing steps in the arithmetic operation processing and the number of processing stages become very large, and in order to obtain images with higher reality, the circuit scale increases in progression, resulting in a low processing speed. For example, a demand has arisen for an apparatus which can process an MPEG2 method proposed as a dynamic image expansion/compression method at a practical speed.

As the problems of the above-mentioned parallel arithmetic operation processing, the problem of a decrease in operation speed and the problem of an increase in consumption power upon an increase in circuit scale are posed. As a result, the problem of an increase in manufacturing cost and the problem of a decrease in manufacturing yield are posed.

Furthermore, a majority logic circuit effective for the arithmetic operation processing circuit is disclosed in Nikkei Electronics "Economical Majority Logic IC Realized by CMOS", 1973, 11. 5. pp. 132–144, as one of digital signal processing methods. This reference discloses a circuit based on a CMOS technique. In this case as well, since the number of elements based on the CMOS technique increases, and the number of stages in the arithmetic operation processing increases, the problems of an increase in circuit scale, an increase in consumption power, and a decrease in operation speed are similarly posed.

SUMMARY OF THE INVENTION

The present invention has been made in consideration of the above-mentioned problems, and has as its object to provide a semiconductor device which can prevent or minimize an increase in circuit scale and an increase in consumption power, and can improve the operation speed.

It is another object of the present invention to provide a semiconductor device which can solve the problems of an increase in manufacturing cost and a decrease in manufacturing yield.

It is still another object of the present invention to provide a semiconductor device which can perform processing with a higher precision by a simpler arrangement.

It is still another object of the present invention to provide a semiconductor device which comprises a plurality of input terminals, a plurality of capacitor means, one terminal of each of which is connected to a corresponding one of the input terminals via a latch circuit, and a sense amplifier to an input side of which the remaining terminals of the capacitor means are commonly connected.

It is still another object of the present invention to provide a semiconductor device in which capacitor means are connected to multiple input terminals and terminals on one side of the capacitor means are commonly connected to an input of a sense amplifier, wherein the semiconductor device has at least first and second semiconductor devices, and the output from the first semiconductor device is input to the second semiconductor device via latch means.

It is still another object of the present invention to provide an operating device, a signal converter, and a signal processing system using the semiconductor device which can achieve the above objects.

BRIEF DESCRIPTION OF THE DRAWINGS

FIGS. 2, 5, and 6 are schematic equivalent circuit diagrams for explaining examples of a semiconductor device of the present invention;

FIGS. 4A to 4C, 9A to 9F, 11A to 11F, and 16A to 16G are timing charts for explaining examples of the operation timings in the respective embodiments;

DETAILED DESCRIPTION OF THE PREFERRED EMBODIMENTS

Figure 1:
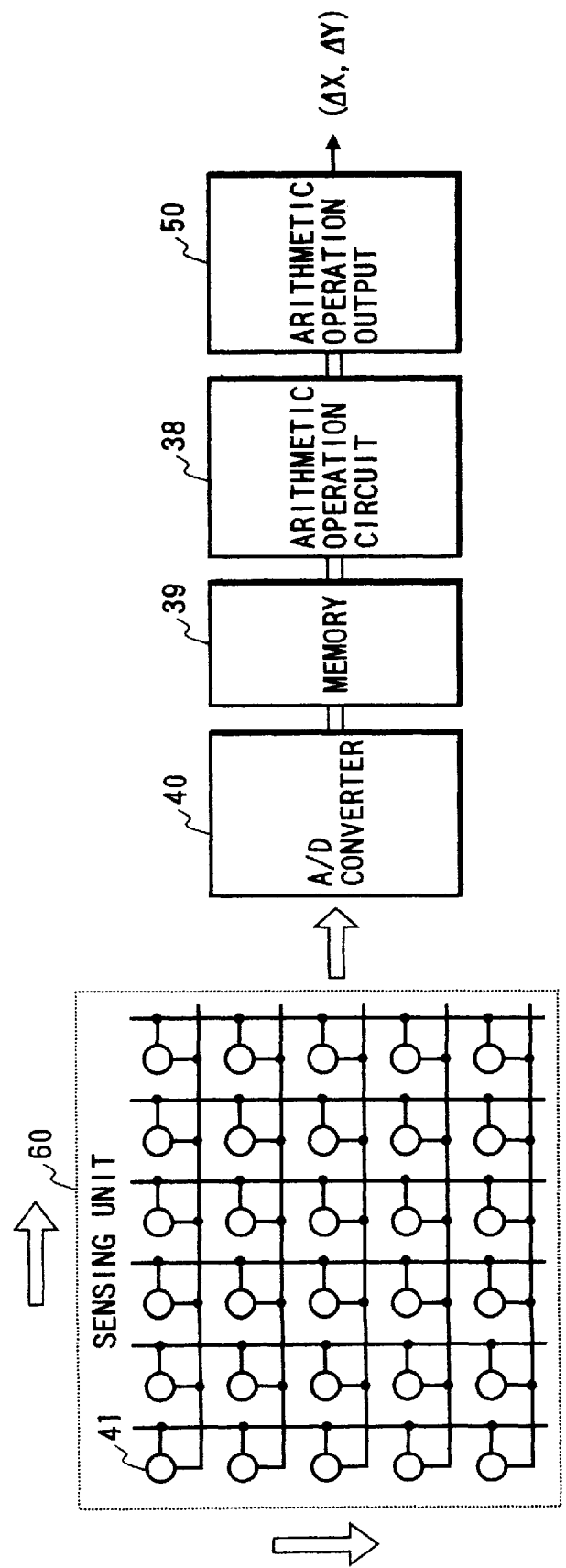
FIG. 1 is a schematic diagram for explaining an example of an image pickup device having an area sensor.

A semiconductor device of the present invention which can achieve the above objects comprises a plurality of capacitor means, one terminal of each of which is connected to a corresponding one of a plurality of input terminals via a latch circuit, and a sense amplifier to an input of which the remaining terminals of the capacitor means are commonly connected.

According to the semiconductor device with the above arrangement, the circuit scale can be reduced, and an increase in the number of connection stages can be prevented. Therefore, the operation speed can be improved, and the consumption power can be saved. In particular, since a latch circuit can simultaneously output data to the subsequent majority logic circuit or arithmetic processing circuit without any delay time among the terminals, the arithmetic processing timings can be easily determined, and a stable arithmetic operation result can be obtained, thus allowing high-speed pipeline processing.

The latch means may output input signals input to the input terminals and inverted signals of the input signals. The latch means can also be formed on a semiconductor chip on which the capacitor means having a large number of input terminals can be formed in a compact structure, thus broadening the dynamic range of signals using non-inverted and inverted signals.

Furthermore, since switch means is arranged between the output terminal of the latch means and the capacitor means, and reset switch means is provided to the commonly connected terminal of the capacitor means, an arithmetic operation with a higher precision can be attained, and the number of parallel processing operations can be increased, thus consequently realizing a high-speed arithmetic operation.

Since the ON period of the reset switch means and a period in which an inverted signal of an input signal is applied to one terminal of the capacitor means via the switch means have at least an overlapping period, simultaneous execution of arithmetic operation periods, removal of offset, and removal of noise components can be attained.

Since one or both of a first diode, the anode of which is connected to the commonly connected terminals of the capacitor means, and the cathode of which is connected to a first power supply, and a second diode, the cathode of which is connected to the commonly connected terminals of the capacitor means, and the anode of which is connected to a second power supply are provided to the input of the sense amplifier, a stable operation of the sense amplifier can be assured with respect to an input signal with a large amplitude.

Furthermore, at least two semiconductor devices described above are arranged, and can be series-connected, so that the output from the semiconductor device of the first stage (i.e., the previous stage with respect to the next stage) is input to the semiconductor device of the next stage, thereby achieving various kinds of high-speed arithmetic processing without causing any timing errors in respective processing stages.

At least first control means for controlling the output from the semiconductor device and second control means for controlling second latch means are arranged, and the operation periods of the first and second control means can have at least a partial overlapping period.

On the other hand, a plurality of semiconductor devices may be arranged, and the output from the first semiconductor device of the plurality of semiconductor devices and/or the inverted output of the output from the first semiconductor device may be input to the second semiconductor device.

In the semiconductor device, when the minimum one of the capacitor means corresponding to the multiple input terminals is represented by C, the total of the capacitance values of the commonly connected capacitor means becomes exactly or substantially an odd multiple value of the minimum capacitance C, and a high-precision arithmetic operation can be assured in an arithmetic operation of, e.g., a majority arithmetic operation circuit.

In addition, a correlation operating device which performs a correlation arithmetic operation using the semiconductor device or a semiconductor device utilizing the semiconductor device can be realized.

Also, a signal converter, which inputs an analog signal to the semiconductor device to output a digital signal corresponding to the analog signal (A/D conversion), and can convert a large number of analog inputs into a multi-bit digital signal, can be realized.

Furthermore, a signal converter, which inputs a digital signal to the semiconductor device to output an analog signal corresponding to the digital signal (D/A conversion) can be realized.

A signal processing system including at least one of the semiconductor device, correlation operating device, and signal converter can be realized. In particular, when the system includes an image input device for inputting an image signal or a storage device for storing information, a combination or integration with the semiconductor device having multiple input terminals can be easily attained, thus assuring higher-grade, higher-speed processing.

The present invention will be described in detail below with reference to the accompanying drawings as needed.

First Embodiment

Figure 2:
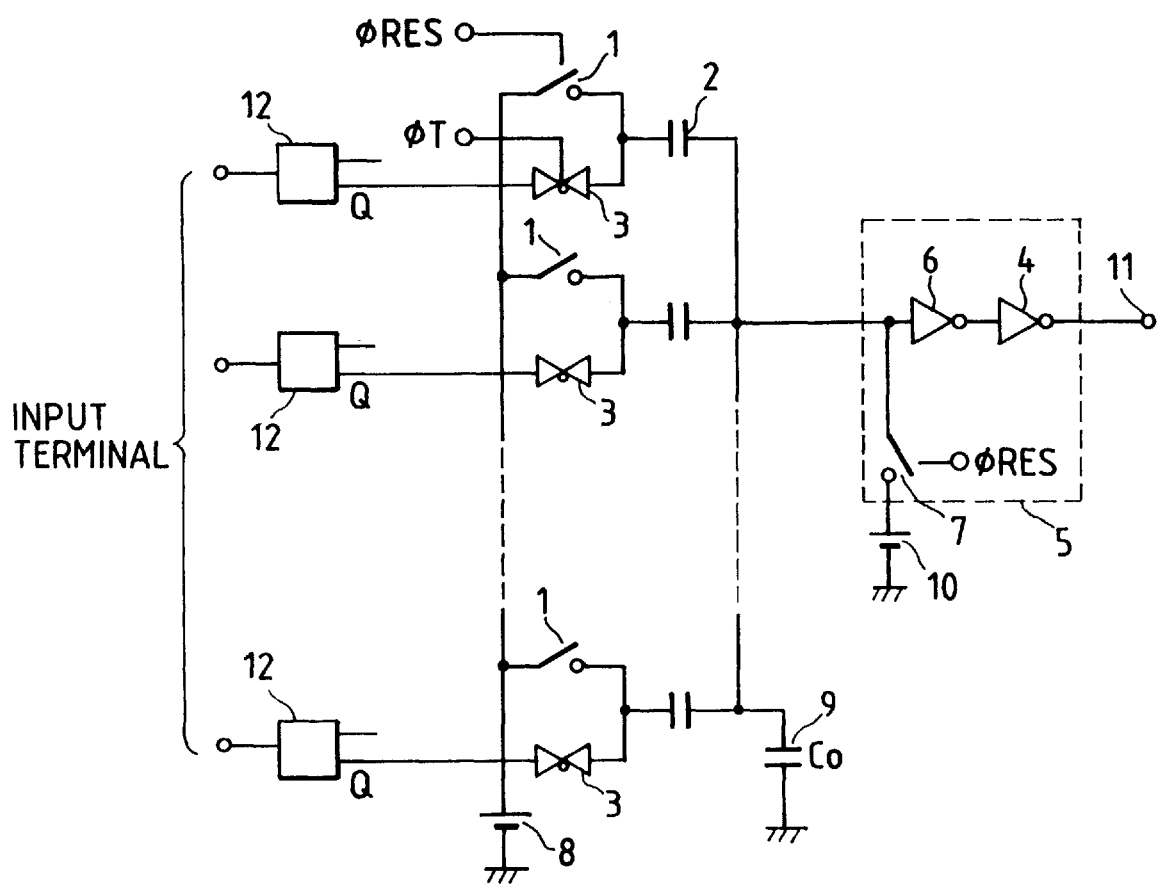

The first embodiment will be described below with reference to FIGS. 2 to 4C. Referring to FIG. 2, a semiconductor device includes reset switches 1, capacitors 2 as capacitor means connected to multiple input terminals, signal transfer switches 3, a sense amplifier 5, an inverter 6 in the sense amplifier, a second inverter 4 in the sense amplifier, a second reset switch 7 for resetting the input terminal of the inverter 6, a reset power supply 8 connected to the reset switches 1, a second reset power supply 10 connected to the second reset switch 7, and an output terminal 11 of the sense amplifier 5.

The semiconductor device also includes a parasitic capacitance ($C_0$) which is connected to the commonly connected terminals of the plurality of capacitors 2, i.e., is present on connection lines extending from the plurality of capacitors 2 to the inverter 6. However, the present invention is not limited to this parasitic capacitance. Furthermore, the semiconductor device includes latch circuits 12.

Figure 3A:
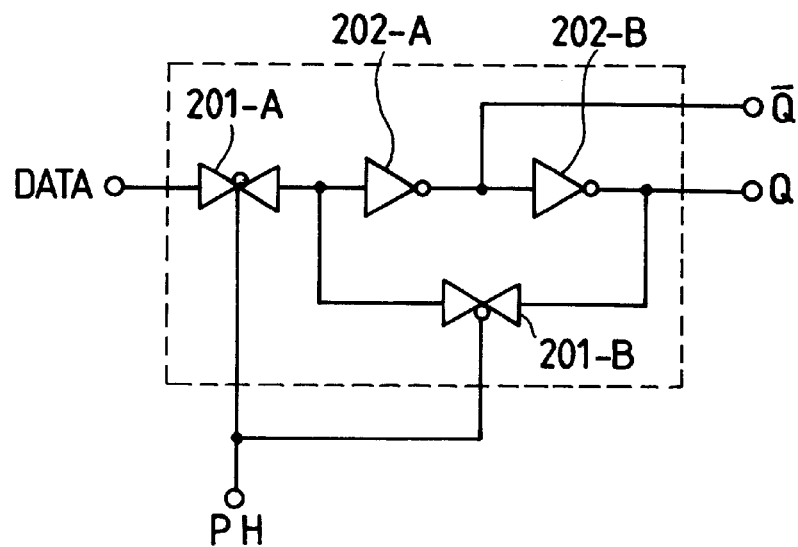
FIGS. 3A and 3B are equivalent circuit diagrams for explaining examples of a latch circuit which is applied to the present invention.
Figure 3B:
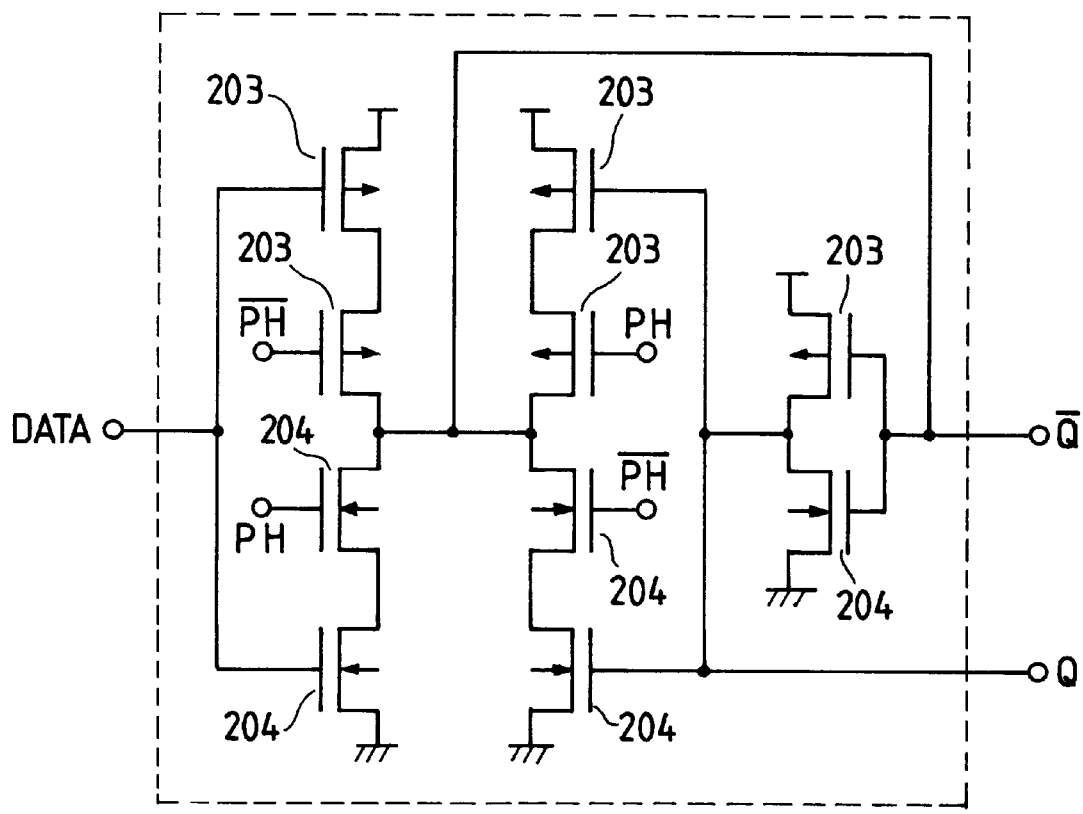

FIGS. 3A and 3B show examples of the arrangement of each latch circuit 12. Referring to FIG. 3A, the latch circuit includes transfer switches 201-A and 201-B, and inverters 202-A and 202-B. When the transfer switch 201-A is enabled by a control signal PH, a signal DATA is transferred to the input terminal of the inverter 202-A. When the transfer switch 201-A is disabled by the control signal PH, the transfer switch 201-B is enabled at the same time to form a positive loop of the inverters 202-A and 202-B, and keeps latching the signal data until the transfer switch 201-A is enabled at the next timing. A non-inverted output Q with respect to the input signal DATA is obtained from the inverter 202-B, and an inverted output $\overline{Q}$ is obtained from the inverter 202-A.

FIG. 3B shows another arrangement of the latch circuit. Referring to FIG. 3B, the latch circuit comprises PMOS transistors 203 and NMOS transistors 204. As in FIG. 3A, a signal DATA is transferred using the control signal PH and an inverted control signal $\overline{PH}$, and the value of the transferred signal is latched until the next application timing of the control signal PH, thus outputting non-inverted and inverted outputs Q and $\overline{Q}$. In the circuits shown in FIGS. 3A and 3B, a binary signal is latched using the inverters. Alternatively, an analog value or a plurality of values may be latched by the latch circuit, and the present invention is not particularly limited to these latch circuits. For example, a circuit for latching an analog signal by adding a sample-hold circuit to the input of an amplifier circuit may be used.

FIGS. 4A to 4C are timing charts for explaining an example of the operation timings of the circuit of this embodiment shown in FIG. 2. An example of the operation of this embodiment will be explained below with reference to FIGS. 4A to 4C. Input signals from the input terminals are latched by the latch circuits 12. The terminals at one side of the capacitors 2 are simultaneously reset in response to a reset pulse φRES. A reset voltage of the reset power supply 8 uses 2.5 V about half the power supply voltage if it is a 5-V system. However, the reset voltage is not limited to this, but another voltage may be used. Alternatively, a plurality of voltages may be used.

At substantially the same time, the input terminal of the inverter 6 in the sense amplifier 5 is reset by enabling the second reset switch 7. At this time, a value near the logic inversion voltage at which the output from the inverter 6 is inverted is selected as the reset voltage of the second reset power supply 10. When the reset pulse φRES is turned off, the two terminals of each capacitor 2 are held at the corresponding reset potentials.

When the plurality of transfer switches 3 are simultaneously enabled in response to a transfer pulse φT (although not shown except for the uppermost switch 3, the transfer pulse φT is input to all the transfer switches 3), the input signals are transferred to the corresponding terminals of the capacitors 2. For example, the potential at one terminal of each capacitor 2 changes from the reset voltage of 2.5 V to an input signal $V_x$. For example, let C be the capacitance of the capacitor 2, and $C_0$ be the capacitance of the parasitic capacitance. When N capacitors 2 are connected in parallel with each other, the potential at the commonly connected terminals of the capacitors 2 changes for one input by capacitance division from the reset potential of the inverter 6 by:

$$|C\times(2.5-V_x)/(N\times C+C_0)[V]\qquad(1)$$

When the input terminal voltage of the inverter 6 changes from a voltage near the logic inversion voltage, the output terminal voltage of the inverter 6 is inverted accordingly. When signals are input to the N input terminals, a sum of N capacitance division outputs is input to the input terminal of the inverter 6. As a result, if the sum of N inputs assumes a positive value, the input terminal of the inverter 6 shifts to a potential higher than the logic inversion voltage, and a HIGH-LEVEL signal is output to the output terminal 11 of the sense amplifier; if the sum assumes a negative value, the input terminal of the inverter 6 shifts to a potential lower than the logic inversion voltage, and a LOW-LEVEL signal is output.

In the circuit of this embodiment, the respective input signals are weighted in correspondence with arithmetic processing to be executed on the basis of the amplitudes of input signals and the capacitances of the capacitors 2 which receive the signals, and these signals are simultaneously subjected to parallel arithmetic processing in the sense amplifier. At this time, the signals input from the input terminals are temporarily latched by the latch circuits 12 immediately before the above-mentioned circuit, and thereafter, the signals are input to the circuit. For this reason, even when the number of parallel arithmetic processing operations increases, and input signals are delayed relative to each other due to, e.g., the delay of connection wiring lines, or noise is mixed in signals due to crosstalk, since the signals are input via the latch circuits 12, the timings of signals to be parallelly input can be adjusted, and the signals are input during a period other than the period with high possibility of mixing of noise, thus substantially removing noise. As a result, high-speed, high-precision parallel arithmetic processing can be realized.

Even when the number of input terminals increases, an increase in circuit scale is only an increase in the number of latch circuits, transfer switches, reset switches, and capacitors in proportion thereto, and a great reduction in the circuit scale and improvement in the manufacturing yield can be attained as compared to a conventional parallel arithmetic processing circuit. In addition, since the circuit scale is reduced, and the operation speed is increased, the consumption power can be saved, needless to say.

Second Embodiment

The second embodiment will be described below with reference to the schematic circuit diagram (equivalent circuit diagram) shown in FIG. 5. Note that the same reference numerals in FIG. 5 denote the parts having the same operations and functions as those in FIG. 2. Referring to FIG. 5, second reset switches 401 of the respective input terminals operate at the same time in response to the reset pulse φRES. Note that the non-inverted output Q from the latch circuit 12 shown in FIG. 3A or 3B is connected to the transfer switch 3, and the inverted output $\overline{Q}$ is connected to the second transfer switch 401 and is then connected to the capacitor 2 via the transfer switch 401. Note that the reset pulse φRES and the transfer pulse φT are also respectively input to the second transfer switches 401 and the transfer switches 3 of other stages in addition to those in the first stage (uppermost set in FIG. 5), although not shown for the sake of simplicity.

The operation of this circuit will be explained below with reference to the timing charts shown in FIGS. 4A to 4C. Input signals are held by the latch circuits 12. One terminal at the input side of each capacitor 2 is reset to the inverted signal $\overline{Q}$ output from the corresponding latch circuit 12 in response to the reset pulse φRES. At substantially the same time, the input terminal of the inverter 6 in the sense amplifier 5 is reset by enabling the reset switch 7. In this case, a value in the neighborhood of the logic inversion voltage at which the output from the inverter 6 is inverted is selected as the reset voltage of the second reset power supply 10. When the reset pulse φRES is turned off, the two terminals of each capacitor 2 are held at the corresponding reset potentials. When the transfer switches 3 are enabled in response to the transfer pulse φT, the non-inverted signals Q from the latch circuits 12 are transferred to the input terminals of the capacitors 2.

With the arrangement of the second embodiment, for example, when the power supply voltage is a 5-V system, the voltage difference between the input signal and the reset voltage can be obtained up to a maximum of 5 V, thus broadening the dynamic range and improving the S/N ratio accordingly.

As can be seen from formula (1) above, as the voltage difference between the input signal and the reset voltage becomes larger, the amount of change, from the reset potential, in potential at the commonly connected output terminal of each capacitor 2 by capacitance division for one input becomes larger. The sense amplifier 5 can perform an arithmetic operation more precisely at higher speed as the amount of change becomes larger, since it detects a small change in potential at the commonly connected terminals of the capacitors 2, and outputs a parallel arithmetic operation result.

Like in the second embodiment, since the input terminal is reset by the inverted signal output from each latch circuit 12, a large change in voltage at the input terminal of the inverter 6 can be assured, and a circuit that can perform a parallel arithmetic operation with higher sensitivity and higher precision can be realized without increasing the circuit scale.

Since the timings of input signals are adjusted and noise is removed as in the first embodiment, a high-speed, high-precision parallel arithmetic operation can be consequently attained. Therefore, the manufacturing yield can be improved as well as a great reduction of the circuit scale. Also, the consumption power is saved, needless to say.

Third Embodiment

Figure 6:
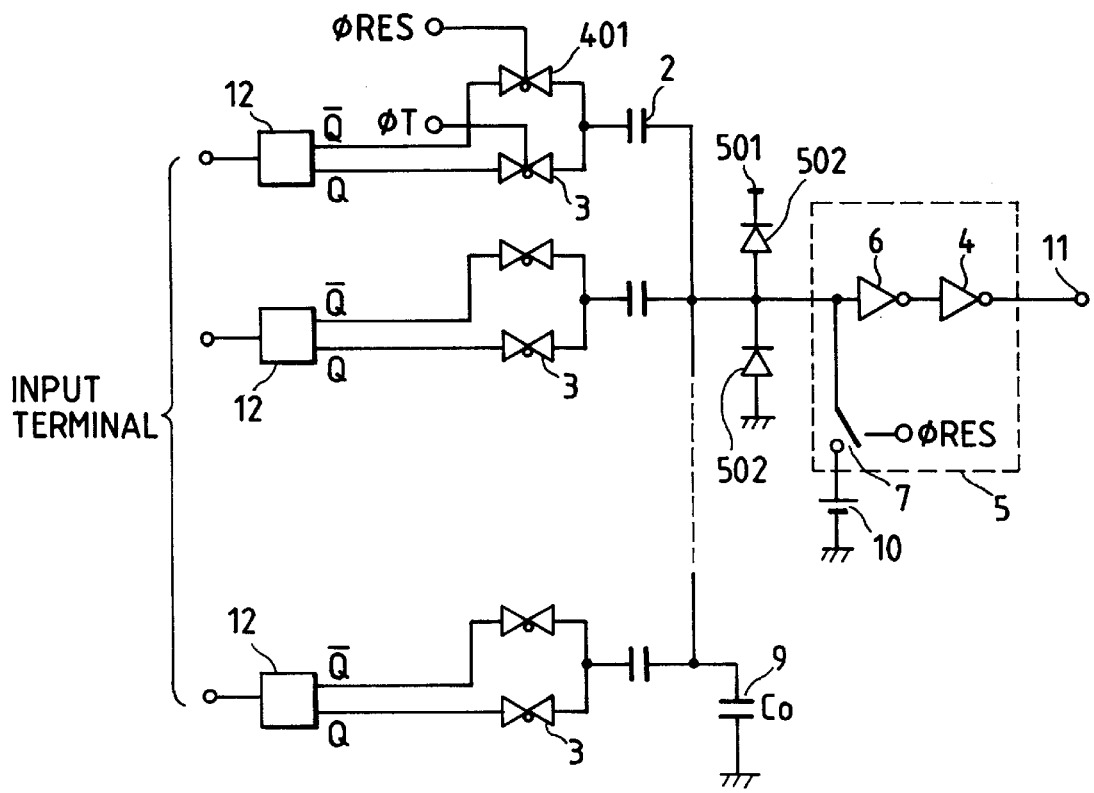

The third embodiment will be described below with reference to the circuit diagram shown in FIG. 6. The same reference numerals in FIG. 6 denote the parts having the same functions as those in FIG. 2 or 5, and a detailed description thereof will be omitted. In this embodiment, the reliability of the circuit is further improved. Referring to FIG. 6, the semiconductor device includes a first power supply 501, and diodes 502. The anode of the lower diode 502 is grounded as the second power supply. Note that the transfer switches 3 and the second transfer switches 401 other than those in the first stage also receive the transfer pulse φT and the reset pulse φRES.

The potential at the commonly connected terminal of each capacitor 2 changes according to formula (1) above for an input of one input terminal, as described above. At this time, a change in potential at the commonly connected terminals becomes a maximum of N times that given by formula (1) for N inputs. For example, when the power supply voltage is a 5-V system, if the parasitic capacitance $C_0$ is negligibly small, a change in potential at the commonly connected terminals is ±5 V. When the reset voltage of the input terminal of the inverter 6 is 2.5 V, the potential of this terminal changes within the range from −2.5 V to +7.5 V.

Figure 7:
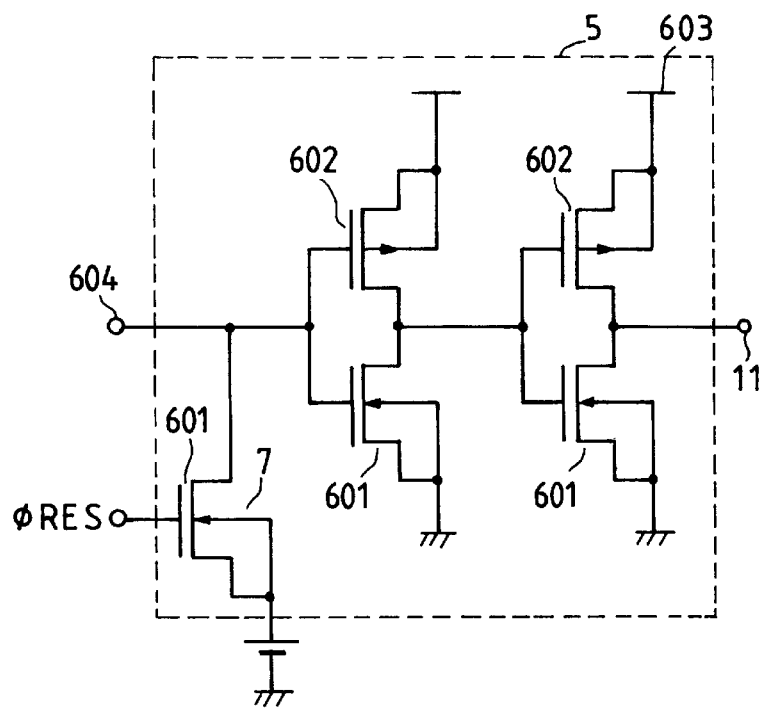
FIG. 7 is a schematic equivalent circuit diagram for explaining an example of a sense amplifier.

In general, the inverter 6 and the reset switch comprise MOS transistors. FIG. 7 shows this example. Referring to FIG. 7, the sense amplifier includes NMOS transistors 601, PMOS transistors 602, a power supply terminal 603, an input terminal 604 of the sensor amplifier 5, which terminal is connected to the commonly connected terminals of the capacitor 2 in FIG. 6, and the output terminal 11 of the sense amplifier 5. For example, when the reset switch 7 is constituted by the NMOS transistor 601, as shown in FIG. 7, if the potential at the input terminal 604 is lowered below 0 V upon input of signals, a current flows through the drain-well path of the NMOS transistor 601 of the reset switch 7, thus impairing the voltage resistance (withstand voltage) of the MOS transistor. As a result, the leakage current undesirably increases. On the other hand, when an unnecessarily high voltage is applied to the pair of MOS transistors 601 and 602 constituting the inverter 6, the gate insulating film is destroyed, and the leakage current increases, thus posing problems in terms of reliability.

In this embodiment, since the diode 502 is connected between the input terminal 604 of the sense amplifier 5 and the power supply 501 and/or between the input terminal 604 and ground, when a potential change exceeding the power supply voltage has occurred, the diode connected between the input terminal 604 and the power supply 501 is forward-biased to escape the charge to the power supply 501 before a high voltage is applied to the gate of the MOS transistor. On the other hand, when a potential change below the ground voltage has occurred, the diode connected between the input terminal 604 and ground is forward-biased to escape the charge to ground before a current flows through the drain-well path of the transistor, thereby improving the circuit reliability.

Fourth Embodiment

The fourth embodiment will be described below with reference to the circuit diagram shown in FIG. 8. The same reference numerals in FIG. 8 denote the parts having the same functions as those in FIG. 2 or 5, and a detailed description thereof will be omitted. By connecting a plurality of parallel arithmetic operation circuits utilizing the semiconductor device of the present invention, higher-level parallel arithmetic processing is realized.

Figure 8:
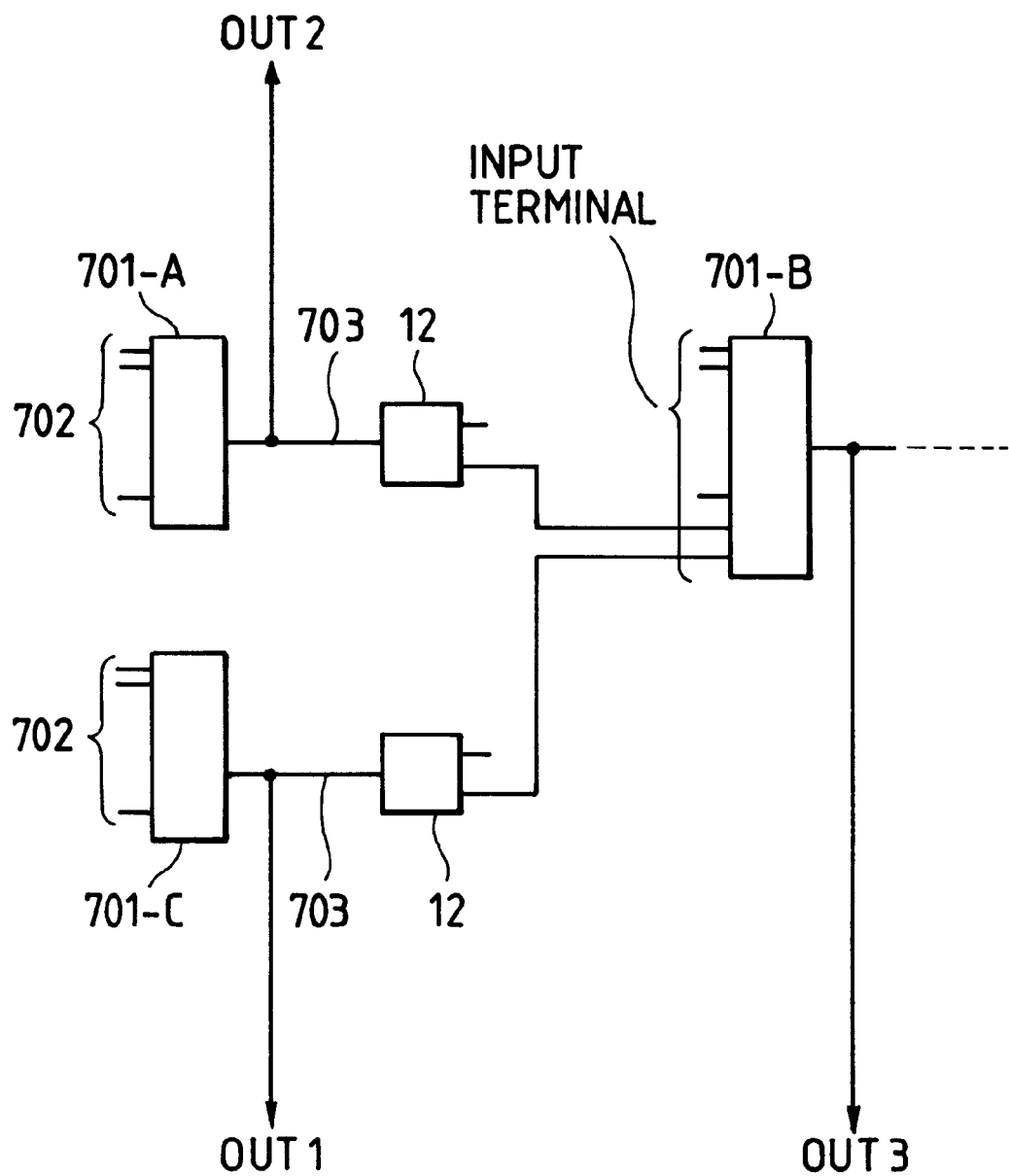
FIGS. 8 and 10 are schematic equivalent circuit diagrams for explaining examples of an operating device of the present invention.
Figure 9:
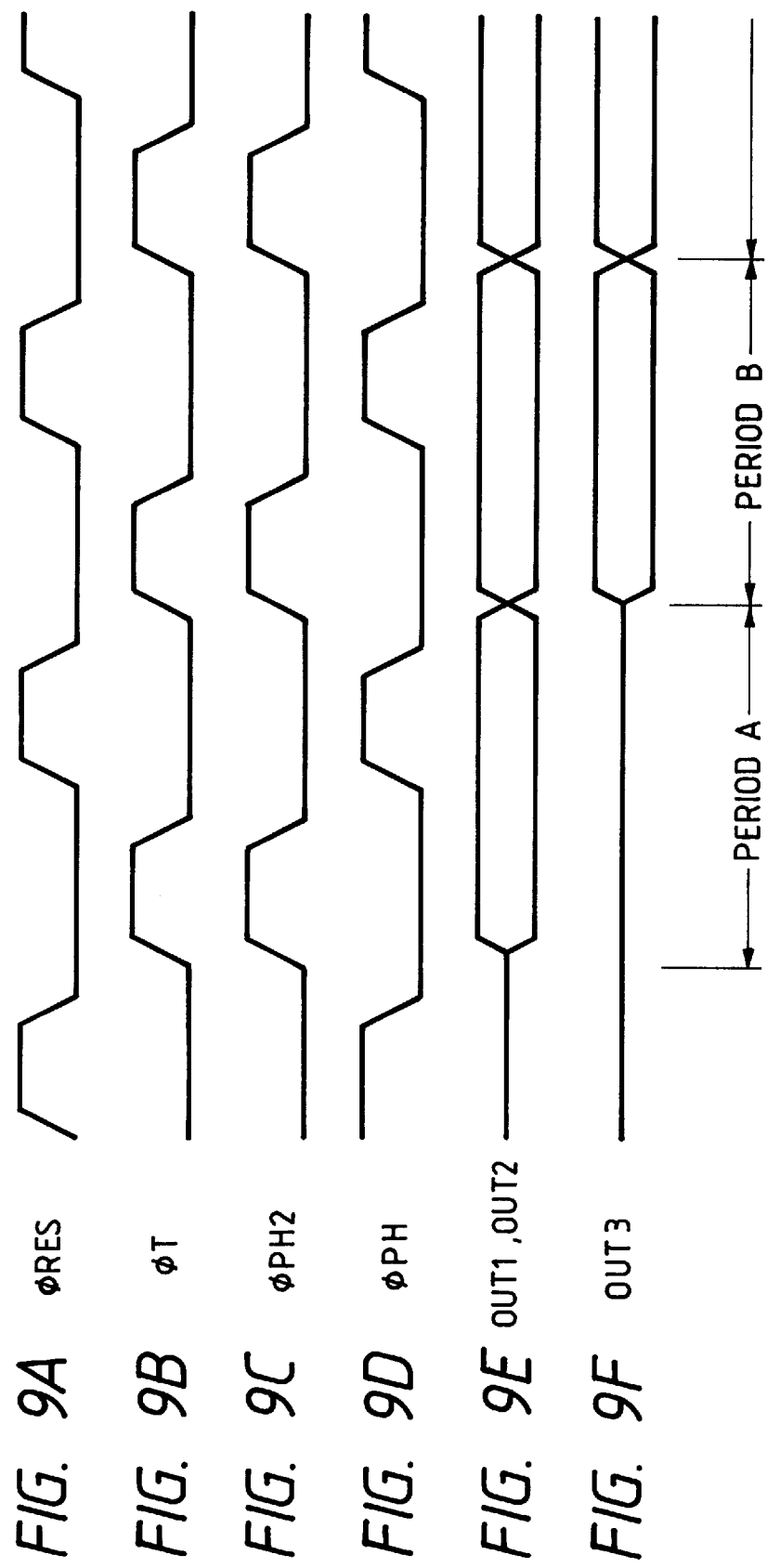

Referring to FIG. 8, each of parallel arithmetic operation circuit blocks 701-A to 701-C according to the present invention has multiple input terminals, and is constituted by latch circuits 12, transfer switches 3, capacitors 2, a sense amplifier 5, and the like. Assume that the first latch circuit in each of the blocks 701-A to 701-C operates in response to a control pulse φPH. Each block has input terminals 702 and an output terminal 703 from the sense amplifier 5, which terminal corresponds to the output terminal 11 shown in FIG. 5. Second latch circuits 12 are assumed to operate in response to the control pulse φPH. The output terminals 703 of the parallel arithmetic operation circuit blocks 701-A and 701-C are connected to the parallel arithmetic operation circuit block 701-B via the second latch circuits 12, and the output signals output from the output terminals 703 serve as input signals to the parallel arithmetic circuit block 701-B. The outputs from similar parallel arithmetic operation circuit blocks are connected to other input terminals of the parallel arithmetic circuit block 701-B. In this manner, when a plurality of parallel arithmetic circuit blocks utilizing the semiconductor device of the present invention are connected in series or parallel with each other, or in combination of serial and parallel connections, higher-level parallel arithmetic processing can be realized.

An example of the basic operation of the fourth embodiment will be described below with reference to the timing chart shown in FIGS. 9A to 9F. In the parallel arithmetic operation circuit blocks 701-A and 701-C, inverted signals of input signals are input from the latch circuits and a reset operation is performed in response to the reset pulse φRES. When signals are then transferred in response to the transfer pulse φT, arithmetic operation results are obtained from terminals OUT1 and OUT2. At the same time, the arithmetic operation results are transferred to the latch circuits 12 via the output terminals 703. The transferred signals are latched by the latch circuits 12 in response to the control pulse φPH. The outputs OUT1 and OUT2 from the parallel arithmetic operation circuit blocks 701-A and 701-C hold the same values as those in the latch circuits 12 during a period A shown in FIG. 9 until the next signals are input. The signals held in the latch circuits 12 are then latched by the latch circuits in the parallel arithmetic operation circuit block 701-B in response to a control pulse φPH2. The parallel arithmetic operation circuit block 701-B receives the outputs from the parallel arithmetic operation circuit blocks 701-A and 701-C and other input signals, and similarly performs an arithmetic operation. Then, the arithmetic operation result of the parallel arithmetic operation circuit block 701-B is output from a terminal OUT3 during a period B shown in FIG. 9 until the next signals are input.

As described above, the pair of parallel arithmetic operation circuit blocks 701-A and 701-C, and the parallel arithmetic operation circuit block 701-B, which are connected in series with each other, sequentially output signals in two adjacent cycles. The time required for the arithmetic operations of the parallel arithmetic operation circuit blocks 701-A to 701-C is the same as that shown in the timing charts of FIGS. 4A to 4C, and a high-speed arithmetic operation can be attained as in the above embodiments.

In this embodiment, since the latch circuits are arranged after the input terminals and between the parallel arithmetic operation circuit blocks according to the present invention, the input terminals are reset by the inverted signal outputs from the latch circuits 12, as described above in the second and third embodiments, thereby realizing a circuit that can attain high-speed parallel arithmetic operations with higher precision without increasing the circuit scale.

Since the timings of input signals are adjusted and noise is removed as in the first embodiment, a high-speed, high-precision parallel arithmetic operation can be consequently attained. Therefore, the manufacturing yield can be improved as well as a great reduction of the circuit scale. Also, the consumption power is saved, needless to say.

In this embodiment, three parallel arithmetic operation circuit blocks are connected. Of course, the present invention is not limited to such a connection, and the circuit blocks can be freely combined to realize desired arithmetic processing. Also, a parallel arithmetic operation circuit block and a conventional semiconductor logic circuit can be combined.

Fifth Embodiment

Figure 10:
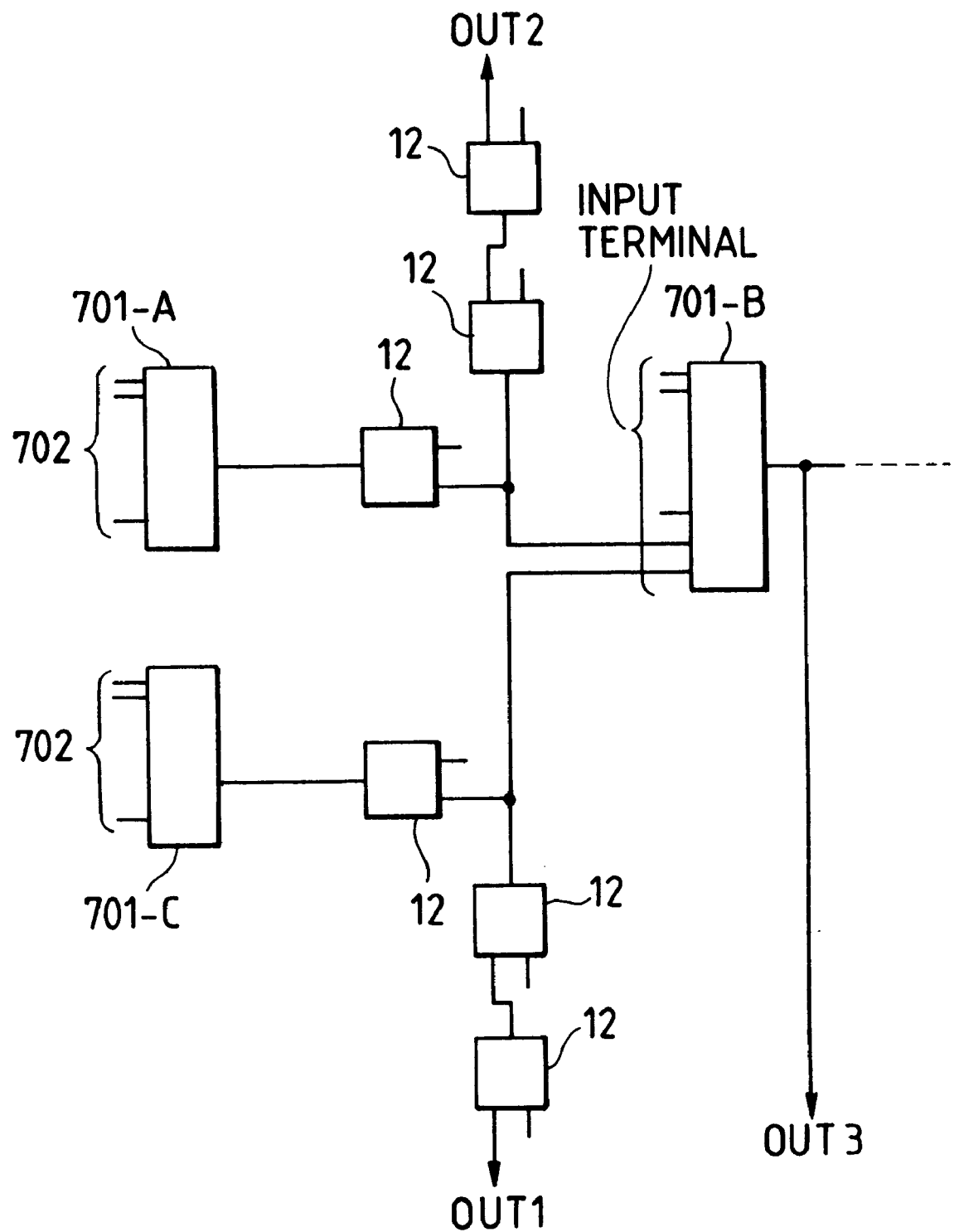
Figure 11:
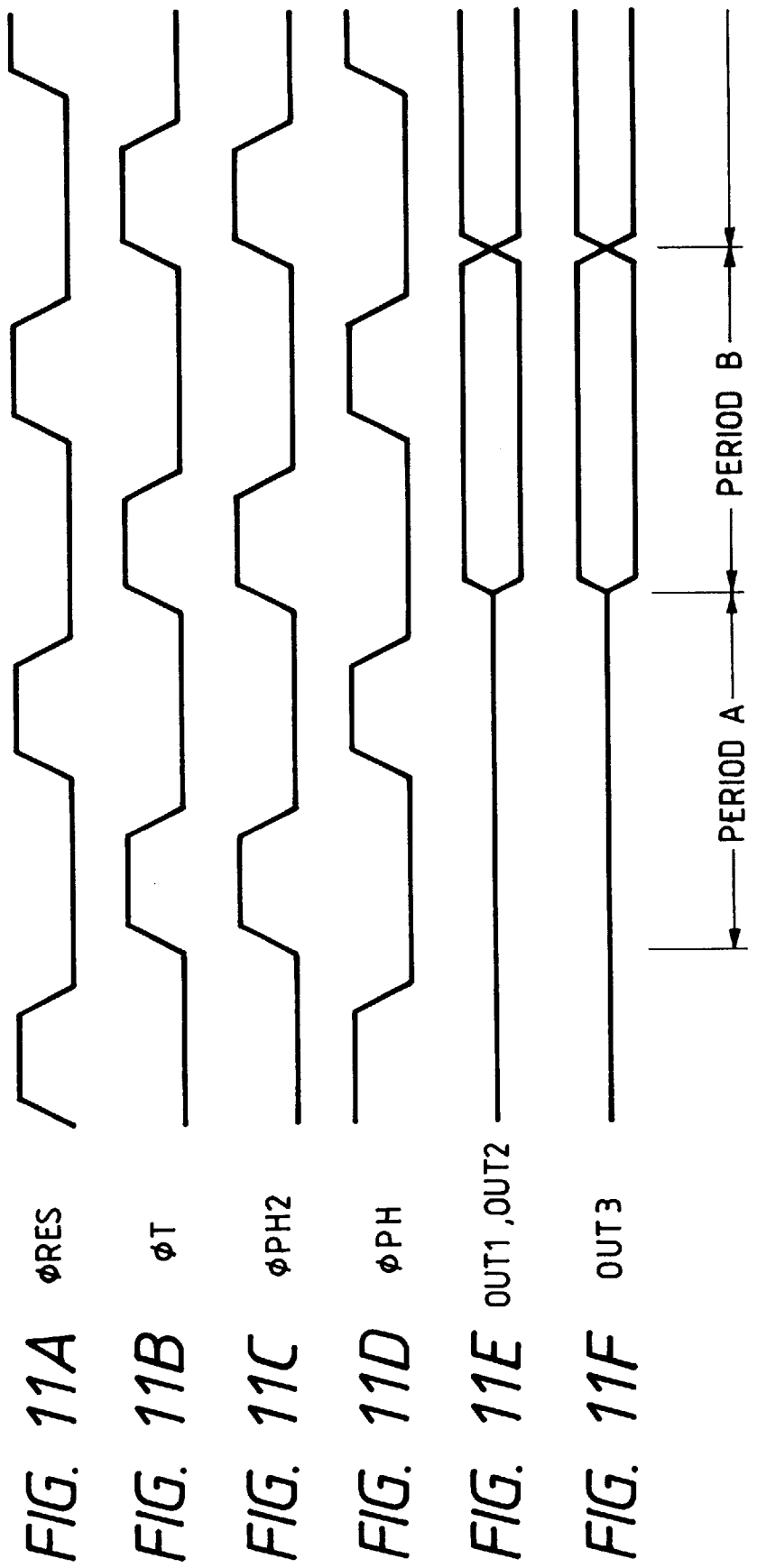

The fifth embodiment will be described below with reference to the circuit diagram shown in FIG. 10. The same reference numerals in FIG. 10 denote the parts having the same functions as those in FIG. 2, 5, 8, or the like, and a detailed description thereof will be omitted. In this embodiment, the output terminals of the parallel arithmetic operation circuit blocks 701-A and 701-C are connected to the parallel arithmetic operation circuit block 701-B via the latch circuits 12, and another two latch circuits 12 are arranged before each of the output terminals OUT1 and OUT2 so as to sequentially connect the non-inverted output Q.

With the arrangement of this embodiment, the outputs OUT1, OUT2, and OUT3 can be output at the same timing, and the subsequent signal processing is facilitated. FIGS. 11A to 11F are timing charts of the operation of this embodiment. A difference from the timing charts shown in FIGS. 9A to 9F described in the fourth embodiment is that the output timing of the output OUT1 and OUT2 is the same as the output timing of the output OUT3. Since other timings are the same as those in the fourth embodiment, a detailed description thereof will be omitted.

Sixth Embodiment

Figure 12:
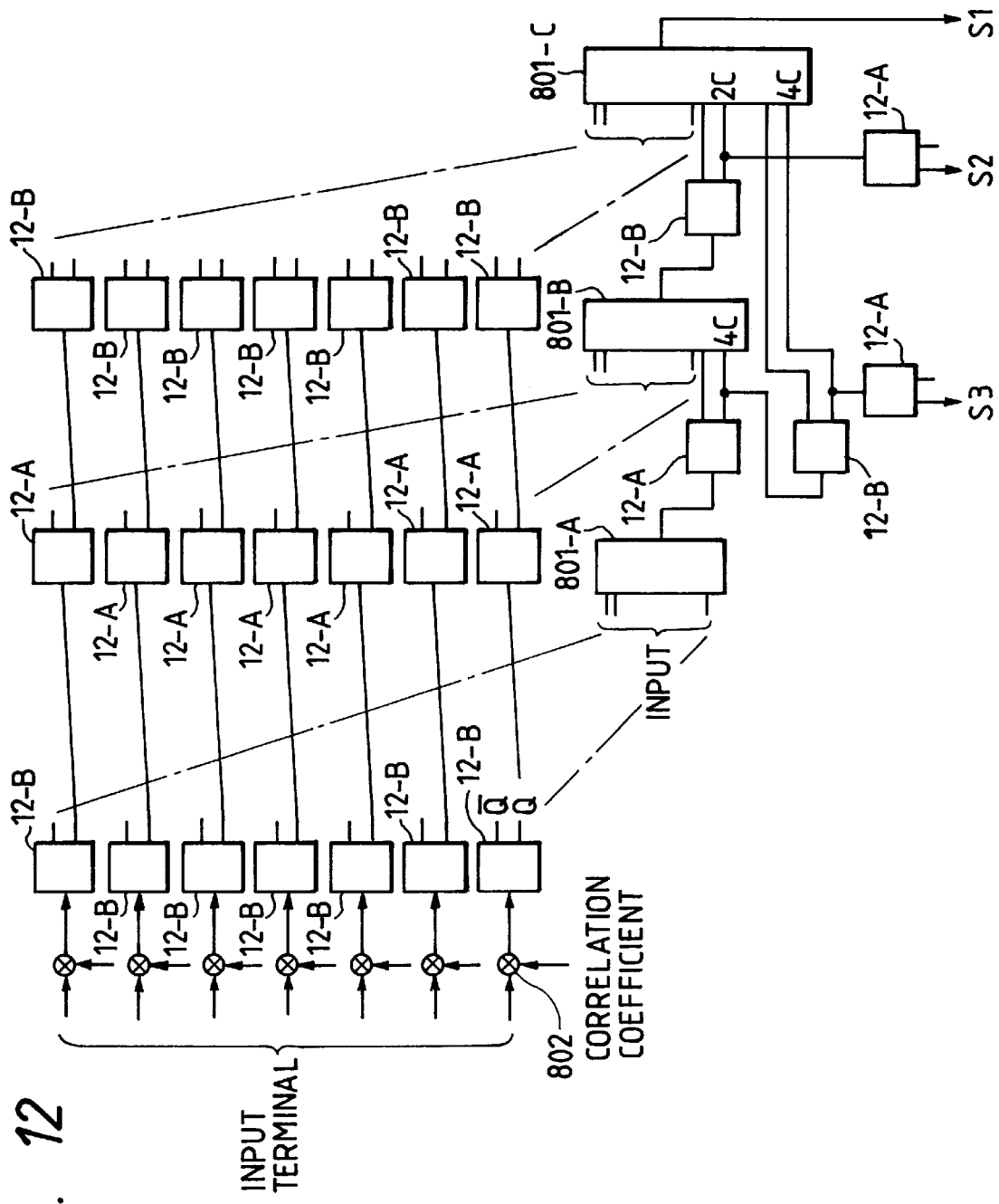
FIG. 12 is a schematic circuit diagram for explaining an example of an operating device of the present invention.
Figure 13:
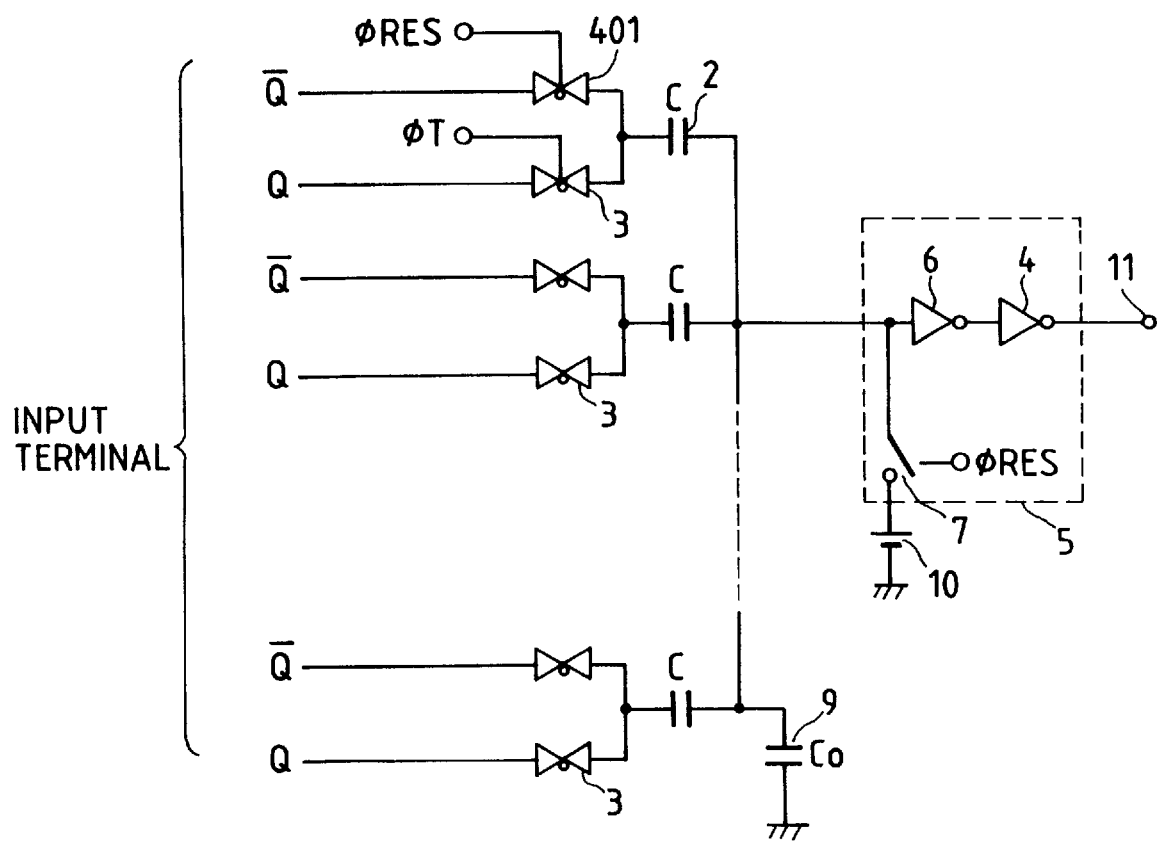
FIGS. 13, 14, and 15 are schematic equivalent circuit diagrams for explaining examples of a parallel arithmetic operation block.
Figure 14:
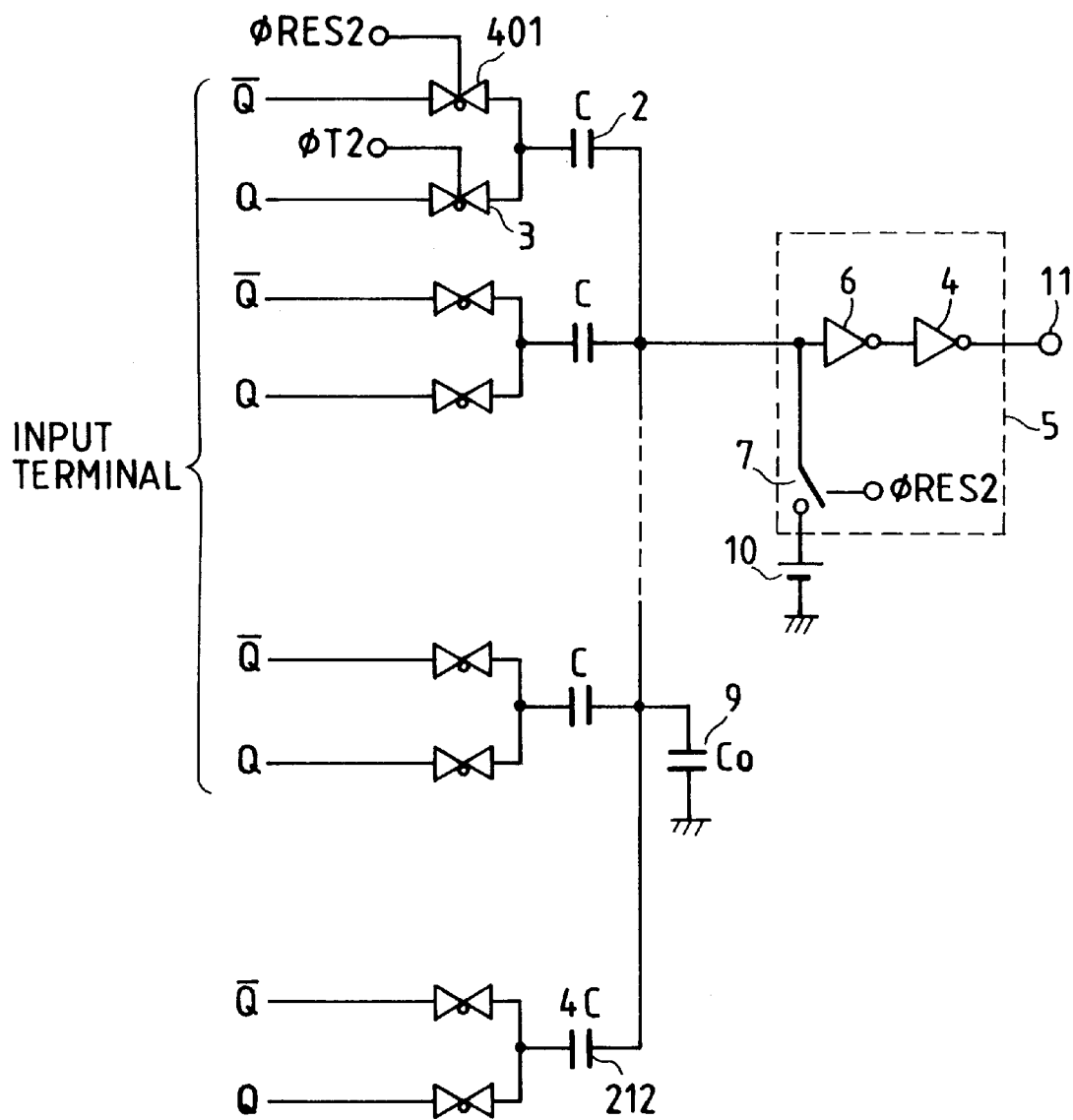
Figure 15:
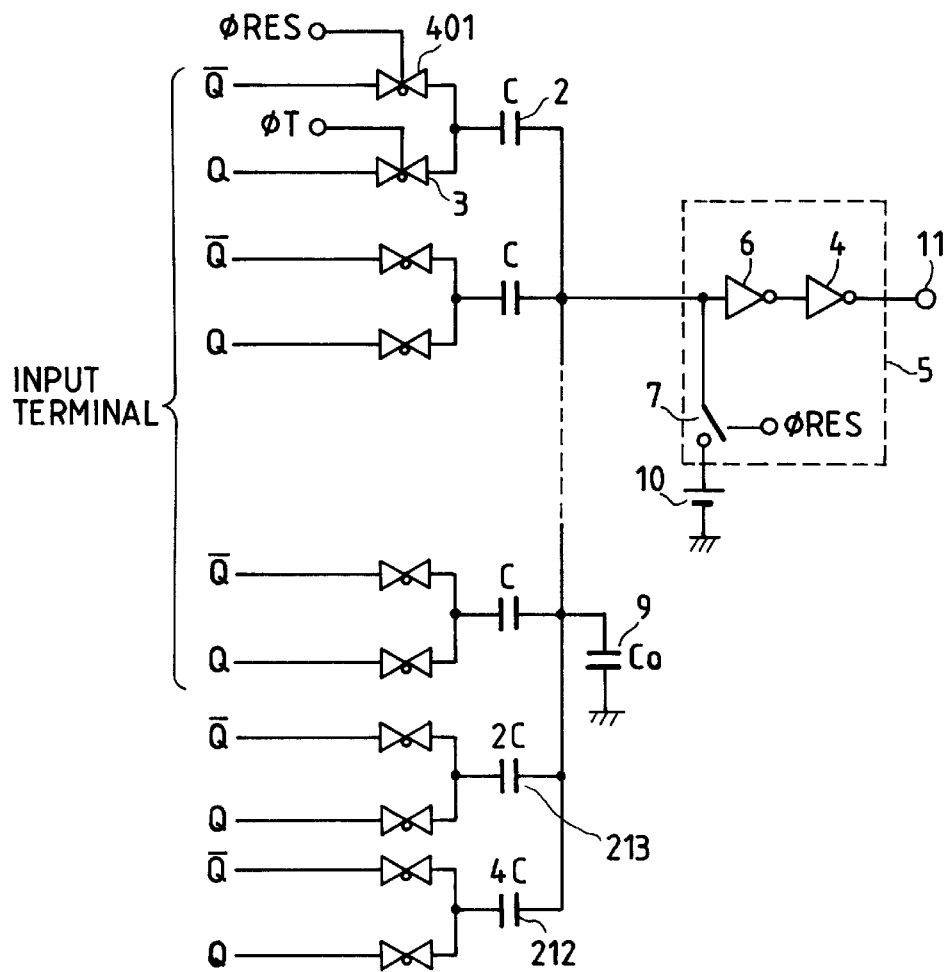

The sixth embodiment will be described below with reference to FIGS. 12 to 16G and Table 1. The same reference numerals in this embodiment denote the parts having the same functions as those in FIG. 2, 5, 8, or the like, and a detailed description thereof will be omitted. FIG. 12 is a schematic circuit diagram of an embodiment in which the present invention is applied to a correlation operating circuit. Referring to FIG. 12, the circuit includes parallel arithmetic operation circuit blocks 801-A to 801-C, comparators 802, and latch circuits 12-A and 12-B. FIGS. 13 to 15 are circuit diagrams of the parallel arithmetic operation circuit blocks 801. FIG. 13 corresponds to the block 801-A, FIG. 14 corresponds to the block 801-B, and FIG. 15 corresponds to the block 801-C. FIGS. 16A to 16G are operation timing charts of this embodiment. In FIGS. 13 to 15, the transfer pulse φT and the reset pulse φRES are input to the transfer switches 3 and the second transfer switches 401 of other stages in addition to those in the first stage (although not shown).

The parallel arithmetic operation circuit blocks 801-A and 801-C operate in response to the reset pulse φRES and the transfer pulse φT. The parallel arithmetic operation circuit block 801-B operates in response to a reset pulse φRES2 and a transfer pulse φT2. The latch circuits 12-A operate in response to the control pulse φPH, and the latch circuits 12-B operate in response to a control pulse φPH2. Outputs S1, S2, and S3 are simultaneously output in synchronism with the above-mentioned timing.

The basic operation will be described below with reference to FIG. 13. As in the second and fourth embodiments described above, the voltages at the two terminals of each capacitor 2 are reset to the reset voltage of the inverted output $\overline{Q}$ of the corresponding latch circuit. When the transfer switches 3 are enabled in response to the transfer pulse φT, input signals are transferred to the input terminals of the capacitors 2, and the potentials at the input terminals of the capacitors 2 change to, e.g., 0 V corresponding to LOW LEVEL or 5 V corresponding to HIGH LEVEL. The commonly connected terminals of the capacitors 2 change by capacitance division for inputs. When the input terminal voltage of the inverter 6 changes from the logic inversion voltage, the output terminal voltage of the inverter 6 is inverted accordingly. When input signals are input to N input terminals, a sum of N capacitance division outputs is input to the input terminal of the inverter 6.

In this embodiment, since the capacitors 2 arranged at the input terminals have substantially the same capacitance values, if the number of HIGH-LEVEL signals of the N inputs is a majority, the input terminal of the inverter 6 shifts to a potential higher than the logic inversion voltage, and a HIGH-LEVEL signal is output to the output terminal 11 of the sense amplifier 5; if the number of LOW-LEVEL signals is a majority, a LOW-LEVEL signal is output. With this arrangement, the circuit shown in FIG. 13 serves as a majority arithmetic operation circuit for outputting a logic value corresponding to a majority of a plurality of inputs.

FIG. 12 shows a 7-input correlation operating circuit as an example. Referring to FIG. 12, input signals are input to the comparators 802 together with correlation coefficients. Each comparator 802 outputs a HIGH-LEVEL signal if the input signal coincides with the correlation coefficient; it outputs a LOW-LEVEL signal if the two inputs do not coincide with each other. The outputs from the comparators 802 are; temporarily latched by the latch circuits 12-B, and thereafter, are input to the majority arithmetic operation circuit block 801-A. At the same time, these outputs are input to the latch circuits 12-A. For example, when the outputs from the comparators 802 are input to the 7-input majority arithmetic operation circuit block 801-A, if the number of HIGH-LEVEL signals is a majority, i.e., if four or more out of seven inputs are HIGH-LEVEL signals, the majority arithmetic operation circuit block 801-A outputs a HIGH-LEVEL signal. Similarly, for example, an 11-input majority arithmetic operation circuit block outputs a HIGH-LEVEL signal if six or more inputs are HIGH-LEVEL signals; a 13-input majority arithmetic operation circuit block outputs a HIGH-LEVEL signal if seven or more inputs are HIGH-LEVEL signals. Column S3 in Table 1 below shows the output values of the 7-input majority arithmetic operation circuit block 801-A in units of the numbers of HIGH-LEVEL signals in inputs. The output S3 in Table 1 is output via the majority arithmetic operation circuit block 801-A, and the latch circuits 12-A, 12-B, and 12-A to adjust its polarity and timing, as shown in FIG. 12.

Subsequently, as shown in FIG. 12, after the output from the majority arithmetic operation circuit block 801-A is latched by the latch circuits 12-A, the polarity of the latched signal is inverted, and the inverted signal is input to a weighted input terminal of the majority arithmetic operation circuit block 801-B.

Referring to FIG. 14, a capacitor 212 has a capacitance value 4C about four times as large as those of the capacitors 2 connected to other input terminal routes. If the capacitance value of each capacitor 2 connected to the input terminal route is represented by C, the majority arithmetic operation circuit block 801-B is equivalent to a circuit in which a total of 11 capacitance values C are commonly connected since the capacitance value 4C of the capacitor 212 is considered as parallel connection of four capacitance values C. The input terminal weighted with the four capacitance values C is applied with the signal from the block 801-A, and other seven input terminals are applied with the signals input to the majority arithmetic operation circuit block 801-A after they are latched by the latch circuits 12-A. As a result, the block 801-B is equivalent to an 11-input majority arithmetic operation circuit.

The reason why the latch circuits 12-A are provided to the non-weighted seven input terminals is to adjust the signal application timings between the weighted input and other input terminals. For example, if four or more out of seven inputs are HIGH-LEVEL signals in the first stage, a LOW-LEVEL signal is applied to the weighted input terminal of the next stage, as described above. Furthermore, in the next state, if six or more of seven inputs of signals applied to the input terminals other than the weighted input terminal are HIGH-LEVEL signals, the 11-input majority arithmetic operation circuit determines a majority as a whole, and outputs a HIGH-LEVEL signal. On the other hand, when four or more and five or less out of seven inputs are HIGH-LEVEL signals, a LOW-LEVEL signal is output since a majority is not determined.

On the other hand, if three or less out of seven inputs are HIGH-LEVEL signals in the first stage, a HIGH-LEVEL signal is applied to the weighted input terminal of the next stage. If two or more and three or less out of seven inputs other than the weighted input terminal of the next stage are HIGH-LEVEL signals, 4+2 (4=weight) or 4+3 (4=weight) yields 6 or more, and a majority is determined, thus outputting a HIGH-LEVEL signal. If one or less is a HIGH-LEVEL signal, 4+0 or 4+1 yields less than 6, and a LOW-LEVEL signal is output. Column S2 in Table 1 shows the output values of the majority arithmetic operation circuit block 801-B in units of the numbers of HIGH-LEVEL signals in inputs. The output S2 in Table 1 is output via the majority arithmetic operation circuit block 801-B, and the latch circuits 12-B and 12-B to adjust its polarity and timing, as shown in FIG. 12.

The majority arithmetic operation circuit block 801-C also has two weighted terminals respectively having a ×4 capacitance value 212 and a ×2 capacitance value 213, as shown in FIG. 15. As shown in FIG. 12, the inverted signal of the output from the majority arithmetic operation circuit block 801-A is applied to the weighted input terminal 4C, the inverted signal of the output from the majority arithmetic operation circuit block 801-B is applied to the weighted input terminal 2C, and signals from the latch circuits 12-B are input to non-weighted seven input terminals. In this manner, since this block 801-C operates as a total of 13 (=7+2+4) input majority arithmetic operation circuit, an output shown in column S1 in Table 1 is obtained. The output S1 in Table 1 is obtained from the majority arithmetic operation circuit block 801-C. Note that the outputs S2 and S3 are output via the latch circuits to adjust their polarities and timings.

With this circuit arrangement, as shown in Table 1, the number of input signals which coincide with the correlation coefficients of a plurality of inputs can be converted into a 3-digit binary value, and the converted value can be output. When the circuit arrangement according to the present invention is used, a correlation operating circuit, which has a smaller circuit scale, can attain higher-speed arithmetic operations, and requires smaller consumption power than a conventional circuit, can be realized.

TABLE 1

| Input | S3 | S2 | S1 |
| --- | --- | --- | --- |
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

Seventh Embodiment

Figure 17:
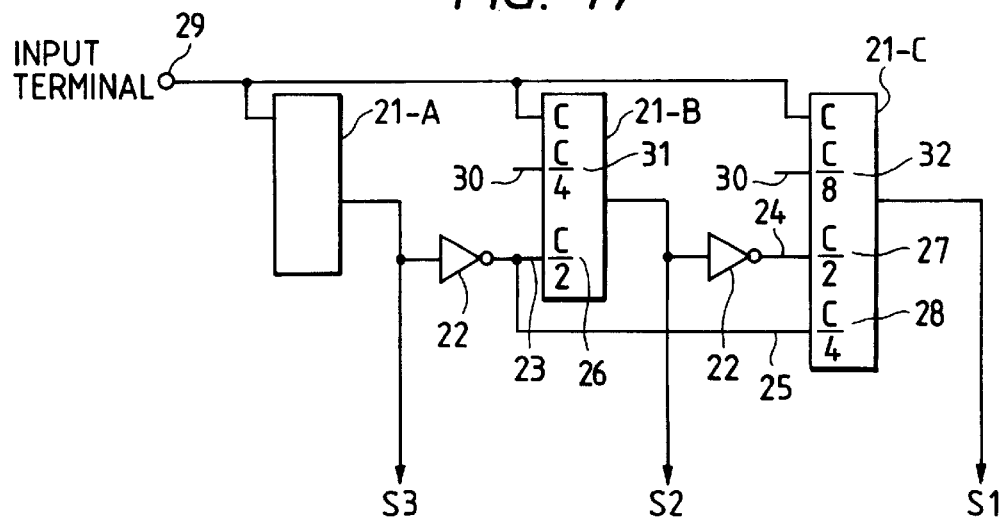
FIG. 17 is a schematic circuit diagram for explaining an example of an analog-to-digital (A/D) converter.

The seventh embodiment will be described below with reference to FIG. 17 and Table 2. This embodiment exemplifies a 3-bit precision analog-to-digital converter (to be referred to as an A/D converter hereinafter). Referring to FIG. 17, the A/D converter includes 1-, 2-, and 3-input arithmetic operation circuit blocks 21-A, 21-B, and 21-C, and inverters 22. The A/D converter also includes input terminals 23, 24, and 25 for receiving the output signals from the previous arithmetic operation circuit blocks. Note that capacitance values 26 and 27 (C/2) and a capacitance value 28 (C/4) are connected in correspondence with the input terminals 23, 24, and 25 (C is the capacitance of a capacitor connected to a normal input terminal). Furthermore, the A/D converter includes an analog input terminal 29, and set input terminals 30. Note that capacitance values 31 (C/4) and 32 (C/8) are connected in correspondence with these terminals. Also, the A/D converter includes digital output signal terminals S1, S2, and S3.

In this embodiment, a case will be described below wherein a 5-V system power supply is used. Referring to FIG. 17, the sense amplifier input in the arithmetic operation circuit block 21-A is reset to 0 V, and those of the arithmetic operation circuit blocks 21-B and 21-C are reset to about 2.5 V. The input capacitors 2 of the signal input terminals 23, 24, and 25, and the set input terminals 30 are reset to 5 V. At this time, the signal input terminal 29 is at 0 V. When the set input terminals 30 are set at 0 V, and the input is changed from 0 V to an analog signal voltage, if the analog input signal becomes equal to or higher than 2.5 V, the sense amplifier input voltage in the arithmetic operation circuit block 21-A exceeds the logic inversion voltage (assumed to be 2.5 V), and a HIGH-LEVEL signal is output. Column S3 in Table 2 below shows the output results.

When the analog input signal is equal to or higher than 2.5 V, the input terminal 23 changes from the reset potential of 5 V to 0 V. The potential change at this time at the sense amplifier input terminal is given by:

$$\{C \times VA - (C/2) \times 5 - (C/4) \times 5\}/(C + C/2 + C/4) \qquad (2)$$

where VA is the analog input voltage.

As can be seen from this formula, the arithmetic operation circuit block 21-B outputs a HIGH-LEVEL signal when the analog signal voltage VA is equal to or higher than 3.75 V, and the block 21-B outputs a LOW-LEVEL signal when the voltage VA is equal to or higher than 2.5 V and less than 3.75 V. Column S2 in Table 2 shows the output results.

Similarly, column S1 in Table 2 shows the outputs from the arithmetic operation circuit block 21-C.

TABLE 2

| Analog Input Voltage | S3 | S2 | S1 |
|---|---|---|---|
| $0.0 \leq VA < 0.625$ | 0 | 0 | 0 |
| $0.625 \leq VA < 1.25$ | 0 | 0 | 1 |
| $1.25 \leq VA < 1.875$ | 0 | 1 | 0 |
| $1.875 \leq VA < 2.5$ | 0 | 1 | 1 |
| $2.5 \leq VA < 3.125$ | 1 | 0 | 0 |
| $3.125 \leq VA < 3.75$ | 1 | 0 | 1 |
| $3.75 \leq VA < 4.375$ | 1 | 1 | 0 |
| $4.375 \leq VA < 5.0$ | 1 | 1 | 1 |

In this embodiment, the 3-bit A/D converter has been described. However, the present invention is not limited to this, as a matter of course, and the number of bits can be easily increased.

In this embodiment, a flash type A/D converter using capacitors has been exemplified. However, the present invention is not limited to this. For example, the present invention may be applied to an encoder circuit section of an A/D converter which performs A/D conversion in such a manner that comparators compare signals input to a resistor array and a reference signal, and an encoder encodes the comparison results, thus obtaining the same effects as described above.

In the above description, the correlation operating device and the A/D converter have been exemplified. However, the present invention is not limited to these units. For example, the present invention may be applied to various other logic circuits such as a digital-to-analog converter, an adder, a subtracter, and the like, thus obtaining the same effects as described above.

Especially, when the present invention is applied to a D/A converter, if the capacitance of the input terminal for receiving LSB data is represented by C, the capacitances need only be set to be twice as large as the immediately preceding value toward the most significant bit like 2C, 4C, 8C, . . . , thus realizing a binary D/A converter. In this case, the outputs from the commonly connected terminals of the capacitors can be received by a source floor amplifier.

As described above, in the circuit block in which the terminals on one side of the capacitor means corresponding to multiple input terminals are commonly connected to the input of the sense amplifier, when the minimum one of capacitances connected to the multiple input terminals is represented by C, the total of the capacitances of the capacitor means is exactly or substantially an odd multiple value of C.

When a correlation circuit has no control input terminal, all the capacitances connected to the input terminals have a minimum value. On the other hand, when the correlation circuit has control input terminals, as has been described above in, e.g., the sixth embodiment, the capacitances connected to the control input terminals are even multiples of C like 2C and 4C, and the total of the capacitances of these terminals and an odd number of input signal terminals is exactly or substantially an odd multiple value of C. With this arrangement, a clear comparison with a desired reference value can be attained, thus improving operation precision.

In the above description, the correlation circuit has been exemplified. In the case of a binary D/A converter, if the signal input capacitance of the least significant bit (LSB) is represented by C, the capacitance of the next bit is 2C, that of the still next bit is 4C, and the like, i.e., the capacitance of each bit assumes a value twice as large as the immediately preceding bit, and the total of capacitances of multiple input terminals becomes exactly or substantially an odd multiple value of C, thus realizing a high-precision D/A converter.

As for the A/D converter, as described above in the seventh embodiment shown in FIG. 17, the number of divisions for discriminating if the analog signal level is higher than or lower than ½ of a full range is set to be an odd number, i.e., 1 in the block 21-A. In the block 21-B, since the discrimination criteria change at ¼, ⅔, ¾, and 4/4 in the order from the uppermost row in column S2 in Table 2, the number of divisions is also set to be an odd number, i.e., 3. Thus, the total of the capacitances can be set to be an odd multiple of the minimum capacitance value, i.e., 1+2+4=7 to have C/4 as a minimum value. Similarly, the block 21-C is set to have C/8 (minimum value), C/4, C/2, and C which are doubled sequentially, i.e., an odd multiple value 1+2+4+8= 15.

With this arrangement, since high-precision arithmetic operations can be attained without requiring any unnecessarily large capacitances, low consumption power, and high-speed arithmetic operations can be realized.

Eighth Embodiment

Figure 18:
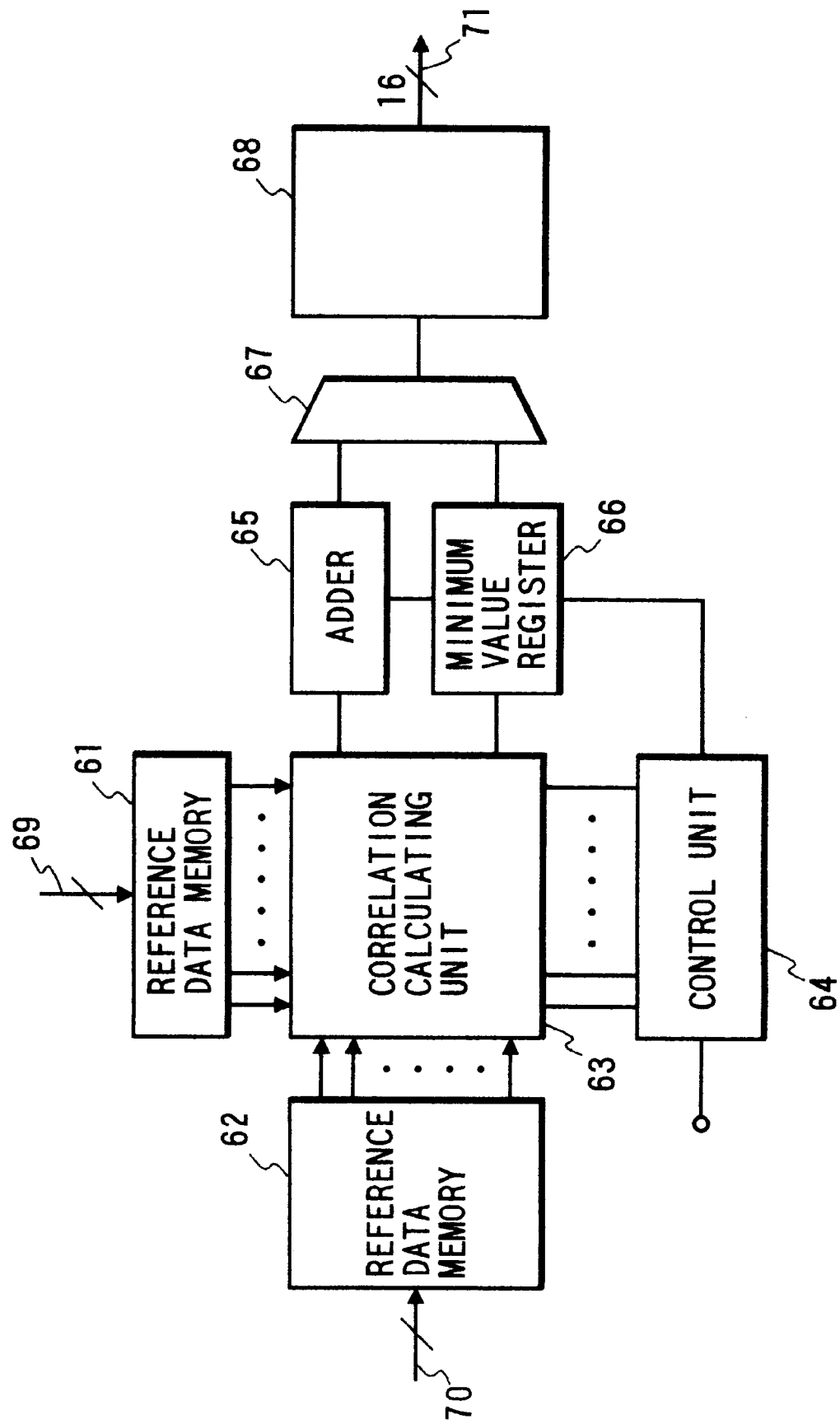
FIG. 18 is a schematic block diagram of an apparatus using a correlation operating device.

FIG. 18 shows the eighth embodiment of the present invention. The eighth embodiment realizes a motion detection chip upon integration of the technique of the present invention and the conventional circuit technique. Referring to FIG. 18, the apparatus includes memories 61 and 62 for storing reference data and reference (comparison) data, a correlation calculating unit 63, a control unit 64 for controlling the entire chip, an adder 65 for adding the correlation results, a register 66 for storing a minimum value of the sums from the adder 65, a comparison storage unit 67 serving as a comparator and a unit for storing the address of the minimum value, and a unit 68 serving as an output buffer and an output result storage unit. A reference data string is input to an input bus 69, and a comparison data string to be compared with the reference data string is input from an input bus 70. The memories 61 and 62 comprise SRAMs, and are constituted by normal CMOS circuits.

Data supplied from the comparison and reference data memories 62 and 61 to the correlation calculating unit 63 can be processed by parallel processing since the unit 63 comprises a correlation circuit of the present invention. For this reason, the unit 63 can not only attain very high-speed processing, but also be constituted by a smaller number of elements, thus reducing the chip size and cost. The correlation arithmetic operation result is scored (evaluated) by the adder 65, and is compared with the contents of the register 66 which stores the maximum correlation arithmetic operation result (minimum sum) before the current correlation arithmetic operation by the comparison/storage unit 67. If the current arithmetic operation result is smaller than the previous minimum value, the current result is newly stored in the register 66; if the previous result is smaller than the current result, the previous result is maintained. With this operation, the maximum correlation arithmetic operation result is always stored in the register 66, and upon completion of the operation of all the data strings, the final correlation result is output from an output bus 71.

The control unit 64, the adder 65, the register 66, the comparison/storage unit 67, and the unit 68 are constituted by conventional CMOS circuits in this apparatus. In particular, when the adder 65 or the like adopts the circuit arrangement including the latch circuits of the present invention, parallel additions can be realized, thus realizing high-speed processing. As has been described above, not only high-speed processing and low cost are realized but also the consumption current can be reduced since arithmetic operations are executed on the basis of capacitances via the latch circuits, thus realizing low consumption power. For this reason, the present invention is suitably applied to a portable equipment such as an 8-mm VTR camera or the like.

Ninth Embodiment

The ninth embodiment of the present invention will be described below with reference to FIGS. 19A to 19C. The ninth embodiment presents a chip arrangement which performs high-speed image processing before image signal data is read out upon integration of the technique of the present invention and an optical sensor (solid-state image pickup element).

Figure 19A:
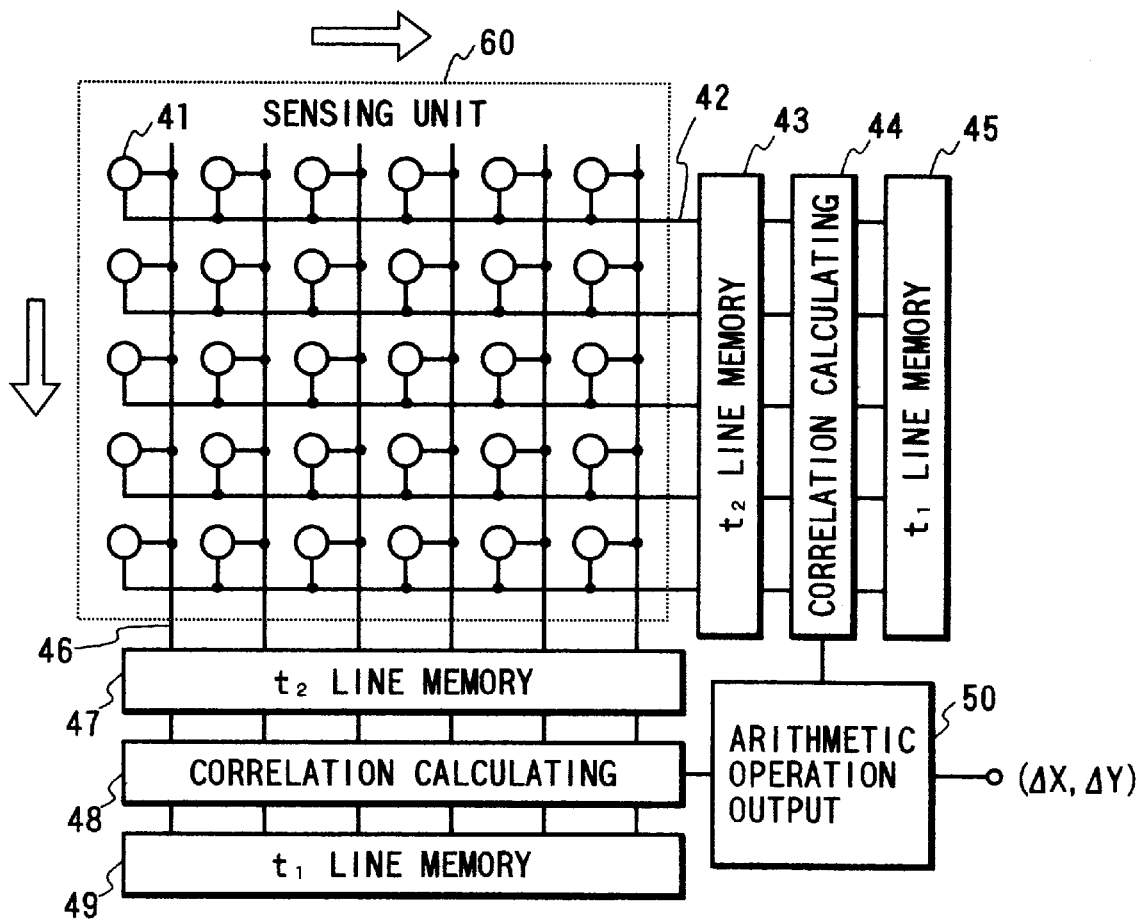
FIG. 19A is a schematic block diagram for explaining an example in which the present invention is applied to an optical sensor.
Figure 19B:
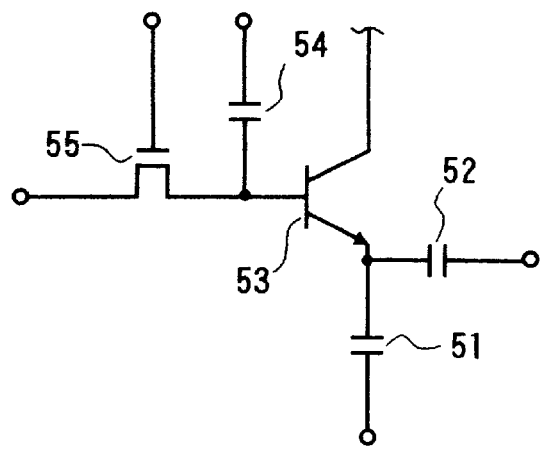
FIG. 19B is an equivalent circuit diagram for explaining an example of the arrangement of a pixel portion.
Figure 19C:
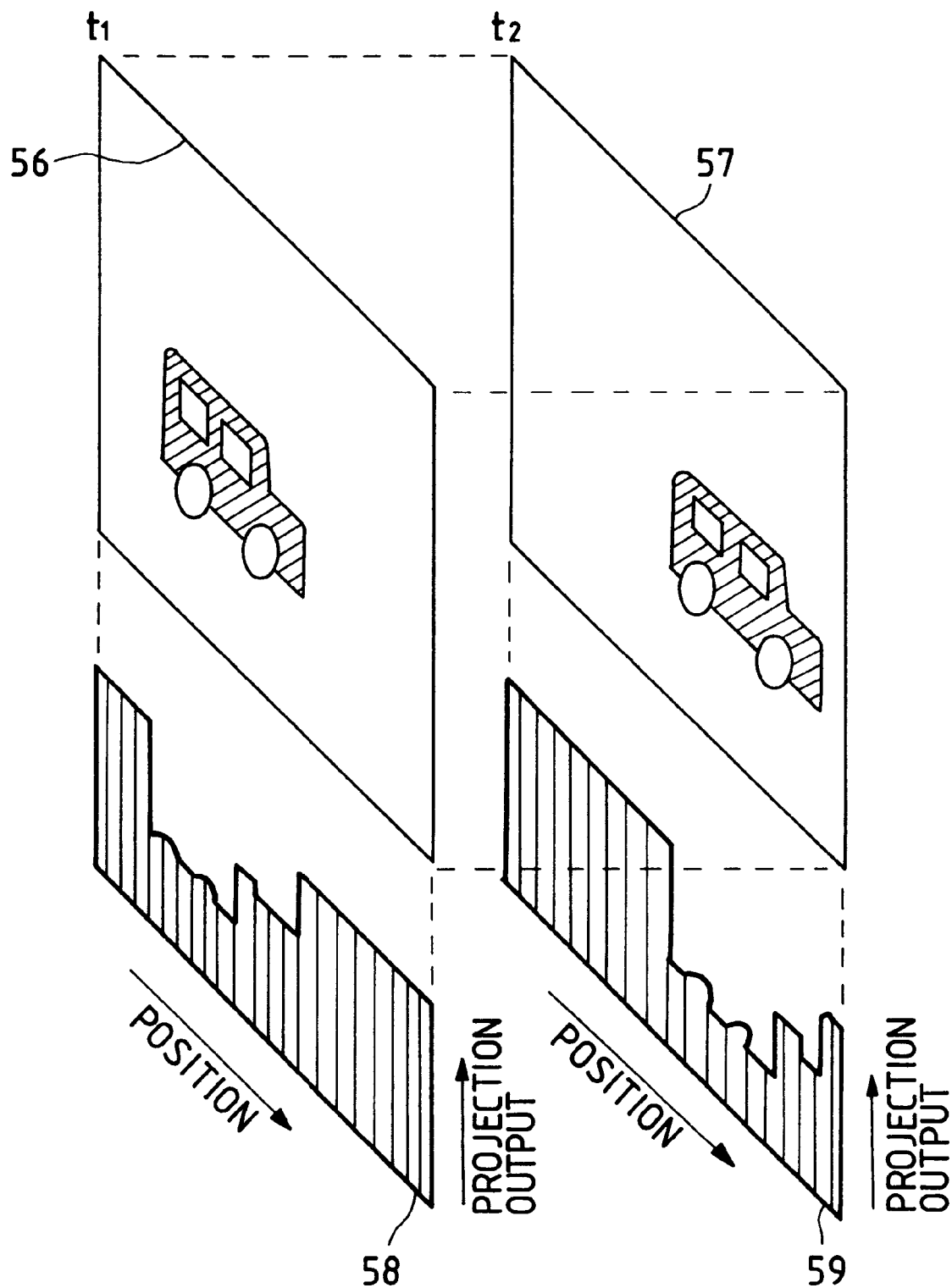
FIG. 19C is an explanatory view for explaining the arithmetic operation contents.

FIG. 19A is a block diagram showing the arrangement of the entire chip of the present invention, FIG. 19B is a circuit diagram showing the arrangement of a pixel portion of the chip of the present invention, and FIG. 19C is a schematic view for explaining the arithmetic operation contents of the chip of the present invention.

Referring to FIG. 19A, the chip includes light-receiving portions 41 each including a photoelectric conversion element, line memories 43, 45, 47, and 49, correlation calculating units 44 and 48, and an arithmetic operation output unit 50. The light-receiving portion 41 shown in FIG. 19B includes coupling capacitor means 51 and 52 for connecting optical signal output terminals and output bus lines 42 and 46, a bipolar transistor 53, a capacitor means 54 connected to the base region of the bipolar transistor, and a switch MOS transistor 55. Image data input to an image data sensing unit 60 is photoelectrically converted by the base region of the bipolar transistor 53.

An output corresponding to the photoelectrically converted photocarriers is read out to the emitter of the bipolar transistor 53, and raises the potentials of the output bus lines 42 and 46 in accordance with an input stored charge signal via the coupling capacitor means 51 and 52. With the above-mentioned operation, the sum of the outputs from the pixels in the column direction is read out to the line memory 47, and the sum of the outputs from the pixels in the row direction is read out to the line memory 43. In this case, if a region where the base potential of the bipolar transistor is raised via the capacitor means 54 of each pixel portion is selected using, e.g., a decoder (not shown in FIGS. 19A to 19C), the sums in the X- and Y-directions of an arbitrary region on the sensing unit 60 can be output.

In the above-mentioned arrangement, as shown in FIG. 19C, when an image 56 is input at time $t_1$, and an image 57 is input at time $t_2$, output results 58 and 59 obtained by respectively adding these images in the Y-direction become image signals representing the moving state of a vehicle shown in FIG. 19C, and these data are respectively stored in the line memories 47 and 49 shown in FIG. 19A. Similarly, data obtained by adding image data in the X-direction are stored in the line memories 43 and 45.

As can be seen from the output results 58 and 59 shown in FIG. 19C, the data of the two images shift in correspondence with the motion of the image. Thus, when the correlation calculating unit 48 calculates the shift amount, the motion of an object on the two-dimensional plane can be detected by a very simple method.

The correlation operating units 44 and 48 shown in FIG. 19A can comprise the correlation operating circuit of the present invention. Each of these units has a smaller number of elements than the conventional circuit, and, in particular, can be at the sensor pixel pitch. This arrangement performs arithmetic operations on the basis of analog signals output from the sensor. However, when the A/D converter of the present invention is arranged between each memory and the output bus line, a digital correlation arithmetic operation can be realized, needless to say.

The sensor of the present invention comprises a bipolar transistor. However, the present invention is also effective for a MOS transistor or only a photodiode without arranging any amplification transistor.

Furthermore, the above-mentioned arrangement performs a correlation arithmetic operation between data strings at different times. Alternatively, when X- and Y-projection results of a plurality of pattern data to be recognized are stored in one memory, pattern recognition can also be realized.

As described above, when the pixel input unit and the circuit of the present invention are combined, the following effects are expected.

(1) Since data which are parallelly and simultaneously read out from the sensor are subjected to parallel processing unlike in the conventional processing for serially reading out data from the sensor, high-speed motion detection and pattern recognition processing can be realized.

(2) Since a 1-chip semiconductor device including a sensor can be constituted, and image processing can be realized without increasing the size of peripheral circuits, the following high-grade function products can be realized with low cost:

(a) control equipment for turning the TV screen toward the user direction (b) control equipment for turning the wind direction of an air conditioner toward the user direction (c) tracing control equipment for an 8-mm VTR camera (d) label recognition equipment in a factory (e) reception robot that can automatically recognize a person (f) inter-vehicle distance controller for a vehicle The integration of the image input unit and the circuit of the present invention has been described. The present invention is effective not only for image data but also for, e.g., recognition processing of audio data.

As described above, according to the present invention, the capacitors are connected to multiple input terminals via latch circuits, and the terminals on one side of the capacitors are commonly connected to the input of the sense amplifier. Thus, data can be processed while adjusting their timings, and noise components can be removed in terms of timings, thus attaining effects such as a reduction of the circuit scale, improvement of the operation speed, and saving of the consumption power as a whole.

Note that the present invention is not limited to the above-mentioned embodiments and description, and appropriate modifications and combinations may be made within the scope of the invention. For example, the latch circuits and the sense amplifier may adopt known arrangements other than those described above.

What is claimed is:

1. A semiconductor device comprising:
   a plurality of input terminals;
   a plurality of capacitor means, one terminal of each of which is connected to a corresponding one of said input terminals via a latch circuit; and
   a sense amplifier having an input portion, remaining terminals of said plurality of capacitor means being commonly connected to said input portion,
   wherein the latch circuit outputs an input signal input to the corresponding one of said input terminals, and an inverted signal of the input signal.

2. A device according to claim 1, wherein a switch is arranged between an output terminal of the latch circuit and corresponding capacitor means, and a reset switch is arranged at the commonly connected terminals of said plurality of capacitor means.

3. A device according to claim 2, wherein an ON period of said reset switch and a period in which the inverted signal of the input signal is applied to the capacitor means via said switch at least overlap each other.

4. A semiconductor device comprising:
   a plurality of input terminals;
   a plurality of capacitor means, one terminal of each of which is connected to a corresponding one of said input terminals via a latch circuit;
   a sense amplifier having an input portion, remaining terminals of said plurality of capacitor means being commonly connected to said input portion; and
   one or both of a first diode, an anode of which is connected to the commonly connected terminals of said plurality of capacitor means, and a cathode of which is connected to a first power supply, and a second diode, a cathode of which is connected to the commonly connected terminals of said plurality of capacitor means, and an anode of which is connected to a second power supply.

5. A semiconductor device comprising:
   a first circuit block comprising plural first input terminals and plural first capacitor means, each said first capacitor means having a terminal connected electrically to a corresponding one of said first input terminals, said first circuit block further comprising a first sense amplifier having a first input section, other terminals of said plural first capacitor means being commonly connected to said first input section; and
   a second circuit block comprising plural second input terminals and plural second capacitor means, each of said second capacitor means having a terminal connected electrically through a latch circuit to a corresponding one of said second input terminals, said second circuit block further comprising a second sense amplifier having a second input section, other terminals of said plural second capacitor means being commonly connected to said second input section,
   wherein at least one of said plural second input terminals is connected to an output from said first sense amplifier of said first circuit block, and all others of said plural second input terminals are connected to input outputs other than the output from said first sense amplifier.

6. A semiconductor circuit comprising a plurality of the semiconductor devices of claim 5, wherein an output from a first semiconductor device of said plurality of semiconductor devices and/or an inverted output of the output from the first semiconductor device is input to a second semiconductor device of said plurality of semiconductor devices.

7. A device according to claim 1, wherein when a smallest capacitance of said plurality of capacitor means is represented by C, a total of capacitance values of the commonly connected capacitor means becomes exactly or substantially an odd multiple value of the smallest capacitance C.

8. A signal converter, which serves as an A/D converter, comprising:
   a semiconductor device comprising:
      a plurality of input terminals;
      a plurality of capacitor means, one terminal of each of which is connected to a corresponding one of said input terminals via a latch circuit; and
      a sense amplifier having an input portion, remaining terminals of said plurality of capacitor means being commonly connected to said input portion,
   wherein said signal converter inputs an analog signal to said semiconductor device to output a digital signal corresponding to the analog signal.

9. A signal converter, which serves as a D/A converter, comprising:
   a semiconductor device comprising:
      a plurality of input terminals;
      a plurality of capacitor means, one terminal of each of which is connected to a corresponding one of said input terminals via a latch circuit; and
      a sense amplifier having an input portion, remaining terminals of said plurality of capacitor means being commonly connected to said input portion,
   wherein the latch circuit outputs an input signal input to the corresponding one of said input terminals, and an inverted signal of the input signal.

10. A signal processing system comprising a signal converter, which serves as an A/D converter, comprising:
    a semiconductor device comprising:
       a plurality of input terminals;
       a plurality of capacitor means, one terminal of each of which is connected to a corresponding one of said input terminals via a latch circuit; and
       a sense amplifier having an input portion, remaining terminals of said plurality of capacitor means being commonly connected to said input portion,
    wherein said signal converter inputs an analog signal to said semiconductor device to output a digital signal corresponding to the analog signal.

11. A system according to claim 10, further comprising an image input device for inputting an image signal.

12. A device according to claim 1, further comprising capacitor means electrically connected to said plurality of capacitor means at said input portion side of said sense amplifier.

13. A semiconductor device comprising:
    a plurality of input terminals;
    a plurality of capacitor means, one terminal of each of which is connected to a corresponding one of said input terminals via a latch circuit;
    a sense amplifier having an input portion, remaining terminals of said plurality of capacitor means being commonly connected to said input portion; and
    a switch connected electrically to said input section of said sense amplifier for resetting said plurality of capacitor means.

14. A device according to claim 12, further comprising a switch provided at said input section of said sense amplifier for resetting said plurality of capacitor means and said further capacitor means.

15. A device according to claim 5, wherein all of said plural first capacitor means are connected to said latch circuit.

16. A device according to claim 5, wherein said one of said plural second input terminals connected to the output of said first circuit block is connected through a second latch circuit.

17. A signal processing system comprising:
a correlation calculating circuit comprising a first circuit block comprising plural first input terminals and plural first capacitor means, each said first capacitor means having a terminal connected electrically to a corresponding one of said first input terminals, said first circuit block further comprising a first sense amplifier having a first input section, other terminals of said plural first capacitor means being commonly connected to said first input portion; and
a second circuit block comprising plural second input terminals and plural second capacitor means, each of said second capacitor means having a terminal connected electrically through a latch circuit to a corresponding one of said second input terminals, said second circuit block further comprising a second sense amplifier having a second input section, other terminals of said plural second capacitor means being commonly connected to said second input section,
wherein at least one of said plural second input terminals is connected to an output from said first sense amplifier of said first circuit block; and
a signal converter, said signal converter being one or both of an A/D converter inputting an analog signal and outputting a digital signal corresponding to the input analog signal, and a D/A converter inputting a digital signal and outputting an analog signal corresponding to the input digital signal,
wherein said signal converter converts signals input to or output from said correlation calculating circuit or said second circuit block.

18. A system according to claim 17, wherein said A/D converter comprises a semiconductor device having a third circuit block provided with plural third input terminals and plural third capacitor means, each of said third capacitor means having a terminal electrically connected to a corresponding one of said third input terminals, and a third sense amplifier having a third input section, other terminals of said plural third capacitor means being commonly connected to said third input section.

19. A system according to claim 18, wherein said third circuit block further comprises a latch circuit provided at said third input terminals.

20. A system according to claim 17, wherein said D/A converter comprises a semiconductor device having a third circuit block provided with plural third input terminals and plural third capacitor means, each of said third capacitor means having a terminal electrically connected to a corresponding one of said third input terminals, and a third sense amplifier having a third input section, other terminals of said plural third capacitor means being commonly connected to said third input section.

21. A system according to claim 20, wherein said third circuit block further comprises a latch circuit provided at said third input terminals.

22. A system according to claim 17, wherein said A/D converter and said D/A converter each respectively comprise a semiconductor device having a further circuit block provided with plural further input terminals and plural further capacitor means, each of said further capacitor means having a terminal electrically connected to a corresponding one of said further input terminals, and a further sense amplifier having a further input section, other terminals of said plural further capacitor means being commonly connected to said input section.

23. A system according to claim 22, wherein each of said further circuit blocks comprises a latch circuit provided at the respective further input terminals.

24. A system according to claim 17, further comprising an image input device for inputting an image signal to be converted by said signal converter.

25. A semiconductor device comprising:
plural circuit blocks,
each of said plural circuit blocks being provided with plural input terminals and plural capacitor means, each of said capacitor means having a terminal electrically connected to a corresponding one of said input terminals within the respective circuit block, and a sense amplifier having an input section, other terminals of said plural capacitor means being commonly connected to said respective input section,
wherein an output of said sense amplifier within at one of said circuit blocks is connected through a latch circuit to an input of another of said circuit blocks.

26. A correlation calculating device comprising:
a semiconductor device having plural input terminals and plural capacitor means, each said capacitor means having a terminal connected electrically to a corresponding one of said input terminals, said semiconductor device further comprising a sense amplifier having an input section, other terminals of said plural capacitor means being commonly connected to said first portion,
wherein said plural input terminals of said semiconductor device are connected to an exclusive NOR circuit for inputting an input signal or a correlation coefficient.

27. A signal processing system comprising a signal converter, which serves as a D/A converter, comprising:
a semiconductor device comprising:
a plurality of input terminals;
a plurality of capacitor means, one terminal of each of which is connected to a corresponding one of said input terminals via a latch circuit; and
a sense amplifier having an input portion, remaining terminals of said plurality of capacitor means being commonly connected to said input portion,
wherein the latch circuit outputs an input signal input to the corresponding one of said input terminals, and an inverted signal of the input signal.

28. A system according to claim 27, further comprising an image input device for inputting a digital image signal to be provided to said semiconductor device.

29. A semiconductor device for performing arithemetic operations, said semiconductor device comprising:
a plurality of input terminals;
a plurality of capacitor means, one terminal of each of which is connected to a corresponding one of said input terminals via a latch circuit, wherein said plurality of capacitor means for performing a weighting process for said arithmetic operations; and
a sense amplifier, having an input portion to which remaining terminals of said capacitor means are commonly connected.

30. A semiconductor apparatus, comprising:
a plurality of semiconductor devices connected to each other for performing arithmetic operations, wherein at least one of said semiconductor devices comprises:
a plurality of input terminals;
a sense amplifier; and
a plurality of capacitors, each capacitor having a first terminal coupled to a corresponding one of said input terminals and a second terminal coupled to an input of said sense amplifier, said plurality of capacitors arranged to perform a weighting process for said arithmetic operations; and
a latch coupled between adjacent ones of said semicondutor devices.

31. A semiconductor device having a semiconductor circuit comprising:
a plurality of input terminals;
a plurality of capacitors; and
an amplifier, wherein
each of said capacitors has a pair of terminals, one terminal of each said capacitors connected through a latch circuit to a corresponding one of said input terminals, the other terminal of said capacitor connected commonly to said amplifier; and
wherein said amplifier is a sense amplifier, comprising inverters of at least two stages connected serially.

* * * * *

UNITED STATES PATENT AND TRADEMARK OFFICE
CERTIFICATE OF CORRECTION

PATENT NO. : 6,166,583
DATED : December 26, 2000
INVENTOR(S) : Tetsunobu Kochi et al.

It is certified that error appears in the above-identified patent and that said Letters Patent is hereby corrected as shown below:

Column 10,
Line 59, "are;" should read -- are --.

Column 20,
Line 36, "first portion," should read -- input section, --; and
Line 39, "to" should read -- to one of either an output signal of an exclusive OR circuit or --.

Signed and Sealed this

Fifth Day of March, 2002

Attest:

JAMES E. ROGAN
*Director of the United States Patent and Trademark Office*

*Attesting Officer*